United States Patent [19]
Berger et al.

[11] Patent Number: 5,589,773
[45] Date of Patent: Dec. 31, 1996

[54] SYSTEM AND METHOD FOR MAKING ELECTROMAGNETIC MEASUREMENTS USING A TILTABLE TRANSVERSE ELECTROMAGNETIC CELL AND A FIXED TILT SAMPLE HOLDER

[75] Inventors: H. Stephen Berger, Georgetown; Martha L. Vela de Casillas, Austin; Harry L. Cochrane, Liberty Hill, all of Tex.

[73] Assignee: Siemens Rolm Communications Inc., Santa Clara, Calif.

[21] Appl. No.: 321,699

[22] Filed: Oct. 12, 1994

[51] Int. Cl.$^6$ ............................. G01R 33/02; B23Q 1/25
[52] U.S. Cl. ............................................. 324/261; 269/55
[58] Field of Search ...................... 324/244, 260, 324261, 262, 95, 96, 627; 73/864.91; 269/289 R, 55, 56, 309, 58, 903

[56] References Cited

U.S. PATENT DOCUMENTS

| | | |
|---|---|---|
| 4,837,581 | 6/1989 | Hansen et al. . |
| 5,119,105 | 6/1992 | Ngai et al. . |
| 5,126,669 | 6/1992 | Honess et al. ........................... 324/261 |
| 5,316,634 | 5/1994 | McLeod ................................. 324/260 |
| 5,332,463 | 7/1994 | Eberlein et al. ........................ 269/903 |
| 5,404,098 | 4/1995 | Osburn .................................. 324/627 |

FOREIGN PATENT DOCUMENTS

| | | | |
|---|---|---|---|
| 681364 | 8/1979 | U.S.S.R. ................. | 324/261 |
| WO93/18558 | 9/1993 | WIPO . | |

OTHER PUBLICATIONS

SCAN, By The Electro–Mechanics Company, "FCC Accepts GTEM Measurements" (and other articles), vol. 1, No. 1, (Sep., 1994).
Glen Watkins, "Using the GTEM to Make FCC Certification Measurements", EMCO Special Advertising Supplement, reprinted from EMC Test & Design, (May, 1994).
GTEM!™ To OA TS Correlation Testing To Allow Use Of A GTEM! For FCC Type Certification Measurements Booklet, pp. 1–26, The Electro–Mechanics Company, (Mar. 24, 1994).
Ellen M. Millen, "FCC Accepts GTEM Data", reprinted from EMC Test & Design, (Jan., 1994).
John D. M. Osburn et al., "The Hyper–Rotated GHz Transverse Electromagnetic (GTEM) Cell, Expanding The Performance Envelope", *Euro EMC Conference Proceedings*, Sandown Exhibition Center England, 5–7 Oct. 1993.
P. Wilson, "On Simulating Oats Near–Field Emission Measurements Via GTEM Cell Measurements", 1993 International Symposium on Electromagnetic Compatibility, Symposium Record, *IEEE*, pp. 53–57, Aug. 9–13, (1993).
GTEM! Domestic Price List, (Mar. 1992, The Electro–Mechanics Company).
GTEM! Brochure, (Nov., 1991, The Electro–Mechanics Company).
John Osburn et al., "New Test Set–Up Challenges Indoor, Outdoor Options" Brochure, Reprinted from *EMC Technology*, (vol. 9, No. 3), (May/Jun. 1990).
P. Wilson et al., "Simulating Open Area Test Site Emission Measurements Based On Data Obtained In A Novel Broadband TEM Cell", IEEE 1989 National Symposium on Electromagnetic Compatibility, Symposium Record, pp. 171–177, May 23–25, (1989).
M. L. Crawford et al., "Using a TEM Cell for EMC Measurements of Electronic Equipment", U.S. Dept. of Commerce/National Bureau of Standards, pp. 1–65, Revised Jul. 1981.
Myron L. Crawford, "Generation of Standard EM Fields Using TEM Transmission Cells", *IEEE Transactions On Electromagnetic Compatibility*, vol. EMC–16, No. 4, pp. 189–195, (Nov., 1974).

*Primary Examiner*—Sandra L. O'Shea
*Assistant Examiner*—Roger Phillips

[57] ABSTRACT

A system and method for assessing the electric and magnetic field generated by equipment under test (EUT) by maintaining the EUT in a specified, fixed tilt position, allowing the EUT to rotate while in that specified position and tilting the TEM cell through at least two angles about the EUT. Embodiments contemplate that a fixed tilt mechanism for maintaining the EUT in a fixed position relative to the tilting of the TEM cell is used. The present invention further contemplates various schemes for determining the electric and magnetic fields generated from the EUT based upon the composite electromagnetic reading from the TEM cell. These schemes, which result in improved measurements of the magnetic and electric fields, determine the angles to which the TEM is tilted.

34 Claims, 14 Drawing Sheets

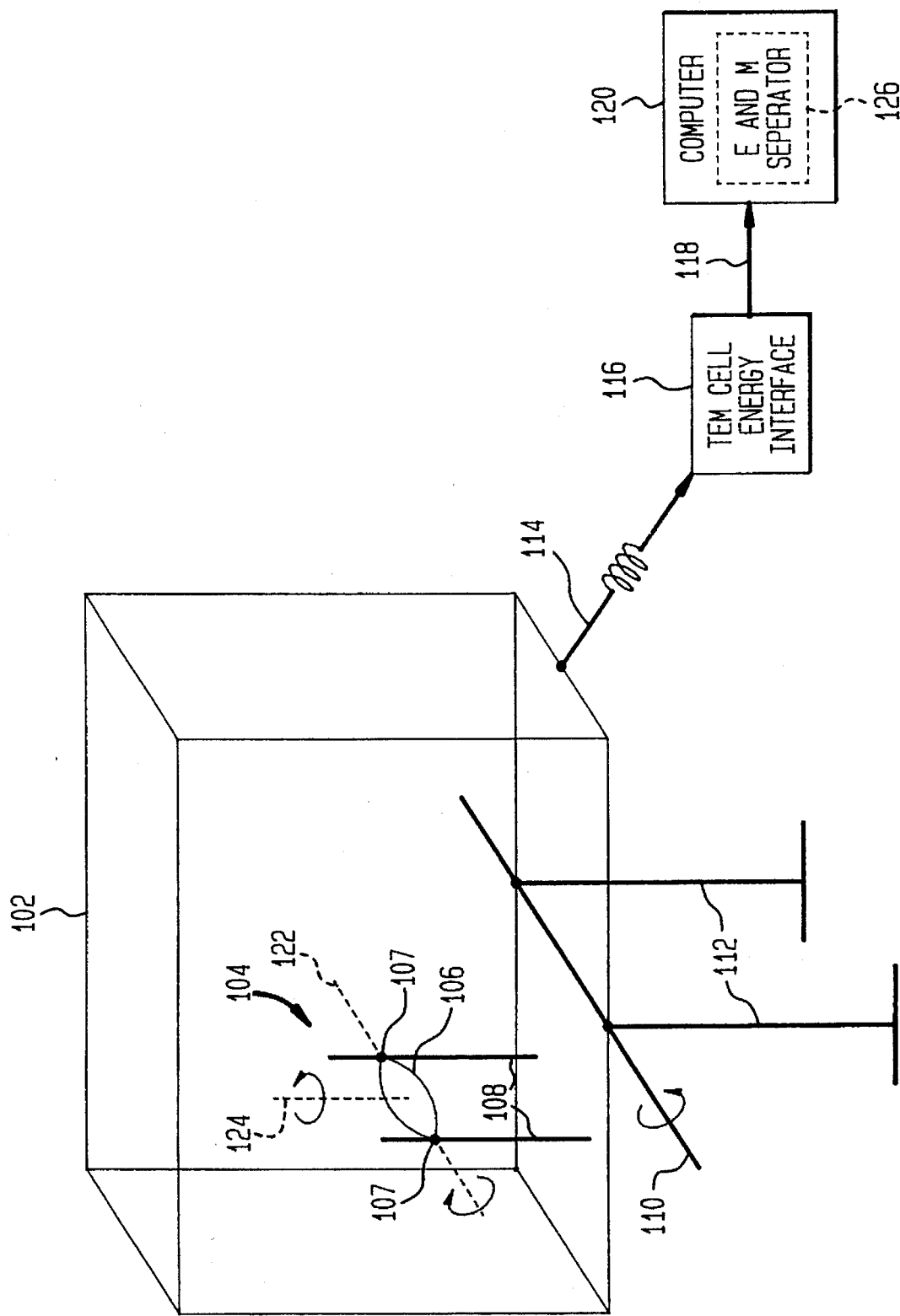

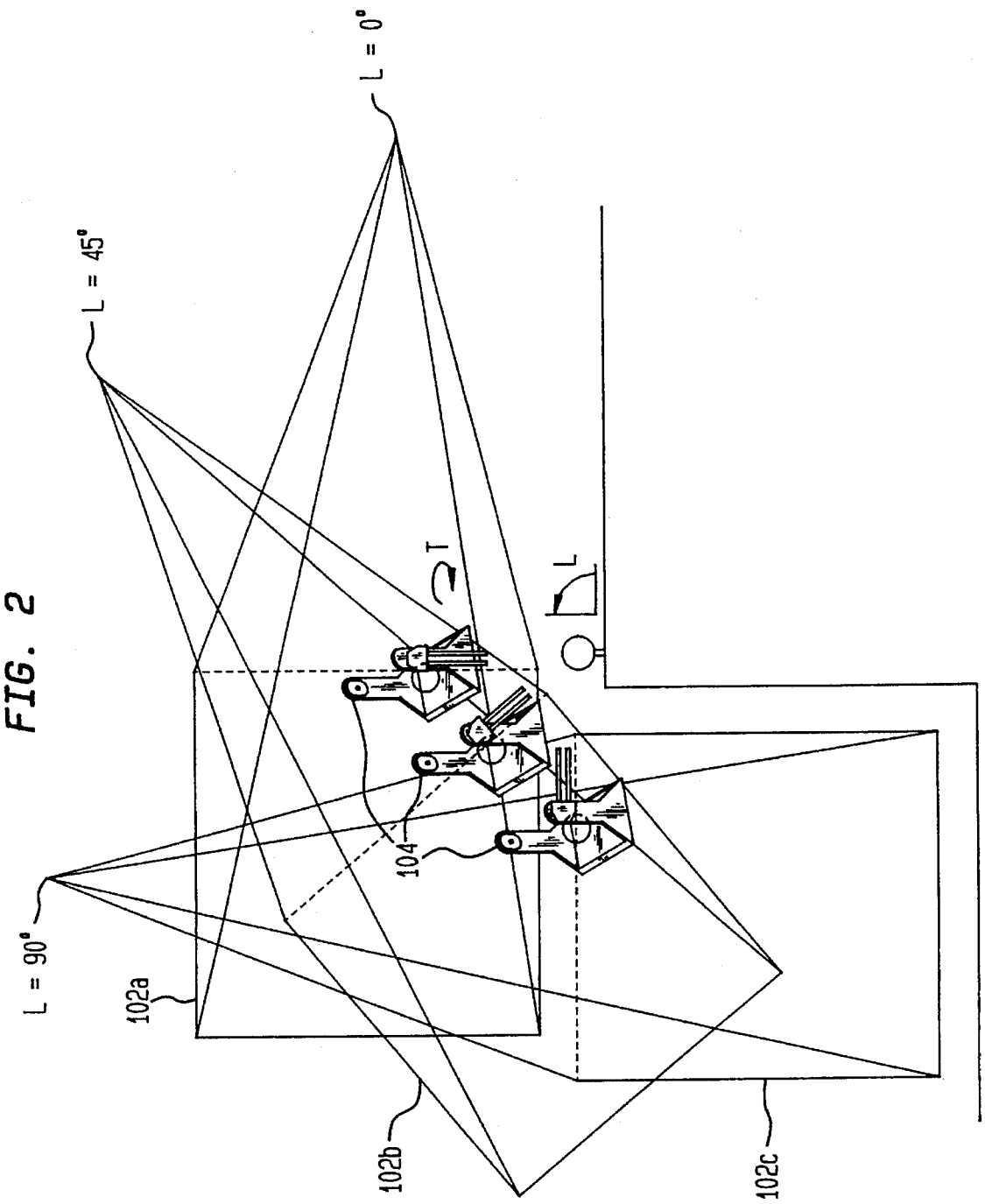

SYSTEM AND METHOD FOR MAKING ELECTROMAGNETIC MEASUREMENTS USING A TILTABLE TRANSVERSE ELECTROMAGNETIC CELL AND A FIXED TILT SAMPLE HOLDER

BACKGROUND OF THE INVENTION

1. Field of the Invention

The present invention relates to a system and method for making electromagnetic measurements of a test object (also known as equipment under test (EUT)) using a transverse electromagnetic (TEM) cell. More specifically, the present invention relates to a system and method for maintaining the EUT in a fixed tilt position and, as contemplated by various embodiments, a horizontal (i.e., "gravity-down") position as the TEM cell is tilted and EUT rotated to specified angles. The electromagnetic readings taken at those angles are then processed to measure the electric field and the magnetic field produced by the EUT.

2. Related Information

Electrical devices such as computers, telephones, etc. all emit a certain amount of electromagnetic radiation, particularly in the radio frequency (RF) portion of the electromagnetic spectrum. More specifically, these devices produce an electric field as well as a magnetic field. Such fields can interfere with the operation of other electrical equipment in the vicinity and, at high enough intensities, can also cause harm to people.

Because of the unwanted effects of electromagnetic fields, it is important to test electrical devices prior to allowing them to be sold or otherwise used. In fact, many countries require that electrical devices meet certain standards before they can be sold. In the U.S., the Federal Communications Commission sets specific limits concerning the maximum amount of electromagnetic radiation that can be emitted by such devices. These limits can be found in 47 CFR (FCC Rules), Parts 15 and 18.

Over the years, various schemes and mechanisms have been devised to measure the electromagnetic radiation emanating from electrical devices. One such device developed in recent years uses a large "cell" into which the equipment under test (hereinafter EUT) is placed. The cell acts as a large coaxial cable, with the center wire running through the cell (in the form of a broad flat plate called a "septum") and the outer electrical casing encompassing the EUT. Electromagnetic measurements taken at one end of the cell give an indication of the electromagnetic radiation emitted from the EUT. The emissions from the EUT develop voltages between the cell septum and the outer cell walls. These voltages may be read to determine the magnitude and frequency of the emissions coming from the EUT.

The "cells" described above are often called Transverse Electromagnetic (TEM) cells. They are referred to as "transverse" because both the electric and magnetic field vectors are everywhere perpendicular to the wave normal. This reproduces the alignment of these fields at large distances from the EUT. TEM cells are described in greater detail in papers such as that written by M. L. Crawford: "Generation of Standard E M Fields Using TEM Transmission Cells," IEEE Transactions on Electromagnetic Compatibility, Vol. EMC-16, No. 4, 1974 p.189–195, which is incorporated by reference herein. Modified TEM cells have been developed which can test for frequencies in the gigahertz range. Such cells include GTEM cells. Other types of cells include WTEM (wire TEM) cells.

The electromagnetic measurements taken from a TEM cell are a composite of the electric and magnetic fields along two specific vectors. Schemes must thus be devised to analyze this information and separate the electric field reading from the magnetic field reading. Often, electric and magnetic radiators are modeled as being comprised of three mutually orthogonal dipole moments (one corresponding to each of the x, y and z axes). The readings taken are analyzed to solve for these dipole moments of the radiating source.

In order to get an accurate reading of the electric and magnetic fields, conventional schemes have dictated that the EUT should be rotated and readings taken at various angles and along various axes. This is because TEM cells can only sense electric fields that are vertical and magnetic fields that are horizontal across the TEM cell's width. For example, the electric field of an antenna placed in a horizontal position will not be detected. Consequently, readings of the EUT must be taken at different positions.

An example of a scheme for analyzing the electromagnetic information taken at various angles and along various axes in a TEM cell has been set forth by Dr. Perry Wilson in "On Simulating OATS Near-Field Emission Measurements Via GTEM Cell Measurements" in the Record of the "1993 IEEE International Symposium on Electromagnetic Compatibility," Aug. 9–13, 1993, Dallas, Tex. pp 53–57, which is incorporated by reference herein. Dr. Wilson's scheme requires that electromagnetic measurements for 9 different positions of the EUT be taken. His scheme then analyzes the readings and yields three magnetic and three electric dipole moments (one corresponding to each of the x, y and z axes for the electric field and also for the magnetic field). In addition to higher frequencies, this scheme also works for electromagnetic emissions below 30 MHz, which are typically difficult to obtain.

A problem with Dr. Wilson's scheme is the very fact that it requires turning and tilting the EUT for taking certain readings. Such movements cause wires such as AC power cables (which act as antennas) that may be part of or attached to the EUT to orient themselves differently relative to the rest of the EUT. This movement is a problem, since the wires themselves can be a source of much electromagnetic radiation, and thus typically need to be taken into account when calculating an EUTs electric and magnetic field. If they become reoriented with respect to the EUT during testing, this reorientation will change the electromagnetic field being radiated, causing inaccuracies in the final results.

One partial solution developed by EMCO of Austin Tex., is to maintain a TEM cell at a tilt angle of 54.736 degrees. Since certain devices such as some printers and medical equipment will simply not work when tilted (which is another problem with schemes that tilt the EUT itself), a rotatable table is inserted into the TEM cell and positioned to maintain the EUT in a horizontal, gravity-down position. EMCO contemplates that the TEM cell can be maintained at this tilt angle and the horizontal table holding the EUT rotated to three different positions to determine the electric and magnetic fields. The scheme for determining the fields assumes a tilt angle of about 54.736 degrees. A discussion describing this can be found in an article by John D. M. Osburn and Edwin L. Bronaugh of EMCO, entitled "The 'Hyper-Rotated' GHz Transverse Electromagnetic (GTEM) Cell, Expanding The Performance Envelope," and is incorporated by reference herein.

The problem with EMCO's approach is that, particularly where the impedance of the EUT is not already known, it has been determined that the readings obtained from this approach are not always as accurate as desired. This is, at least in part, because the number of viewpoints at which readings are taken is insufficient. In addition, this approach does not work for electromagnetic emissions below 30 MHz. Further, if readings at an angle other than 54.736 degrees were desired, the table used by EMCO would have to be manually readjusted for each angle, and a new scheme for determining the electric and magnetic fields would have to be implemented.

Thus, what is needed is a scheme for deriving sufficient information from a TEM cell to determine accurate results of the electric and magnetic fields of the EUT so as not to require tilting the EUT. The scheme should permit results to be obtained for "lower" frequencies (e.g., below the 30 MHz level). Further, such a scheme should reduce any reorientation of cables, such as AC power cables or data cables which must exit the cell, from causing errors in the ultimate field readings. If such a scheme necessitates tilting the TEM cell, what is then also needed is a device that maintains the EUT in a fixed tilt position, (e.g., a horizontal or "gravity-down" position) throughout the tilting, thus allowing the automation of the testing procedure.

SUMMARY OF INVENTION

The present invention overcomes the deficiencies mentioned above by providing a system and method for maintaining the EUT in a specified, fixed tilt position (i.e., at a fixed angle relative to the ground upon which the TEM cell is positioned), allowing the EUT to rotate while in that specified position and tilting the TEM cell through at least two angles about the EUT. An accurate assessment of the electric and magnetic field generated by the EUT can then be obtained. Specifically, embodiments of the present invention contemplate the use of a fixed tilt mechanism for maintaining the EUT in a fixed position relative to the tilting of the TEM cell. This position is often the gravity-down position (for reasons mentioned above), and embodiments contemplate that the fixed tilt mechanism comprises a rotatable table upon which the EUT can be placed and rotated. In addition, various embodiments also contemplate that the fixed tilt mechanism acts to keep the EUT within a portion of the TEM cell that is favorable for the collection of electromagnetic data, and that the cables attached to the EUT are positioned and connected within the TEM cell in a way that allows their electromagnetic field to be accurately calculated as part of the overall field generated by the EUT.

The present invention further contemplates various schemes for determining the electric and magnetic fields generated from the EUT based upon the composite electromagnetic reading from the TEM cell. These schemes, which result in improved measurements of the magnetic and electric fields, determine the angles to which the TEM is tilted. (The tilting, consequently, emphasizes the importance of using the fixed tilt mechanism mentioned above.) Thus, the TEM cell is tilted and EUT rotated to specified angles in accordance with these schemes, and electromagnetic measurements are taken at each specified angle. As can be seen, then, these schemes allow the electric and magnetic fields to be determined with a high level of precision and without the need to move the EUT from its specified fixed position.

BRIEF DESCRIPTION OF THE DRAWINGS

Various objects, features, and attendant advantages of the present invention can be more fully appreciated as the same become better understood with reference to the following detailed description of the present invention when considered in connection with the accompanying drawings, in which:

FIG. 1a is a general depiction of various features of embodiments of the present invention and environments thereof.

FIG. 2 is a first view of the TEM cell as tilted about an axis through three different angles.

DETAILED DESCRIPTION

Figure 1B:
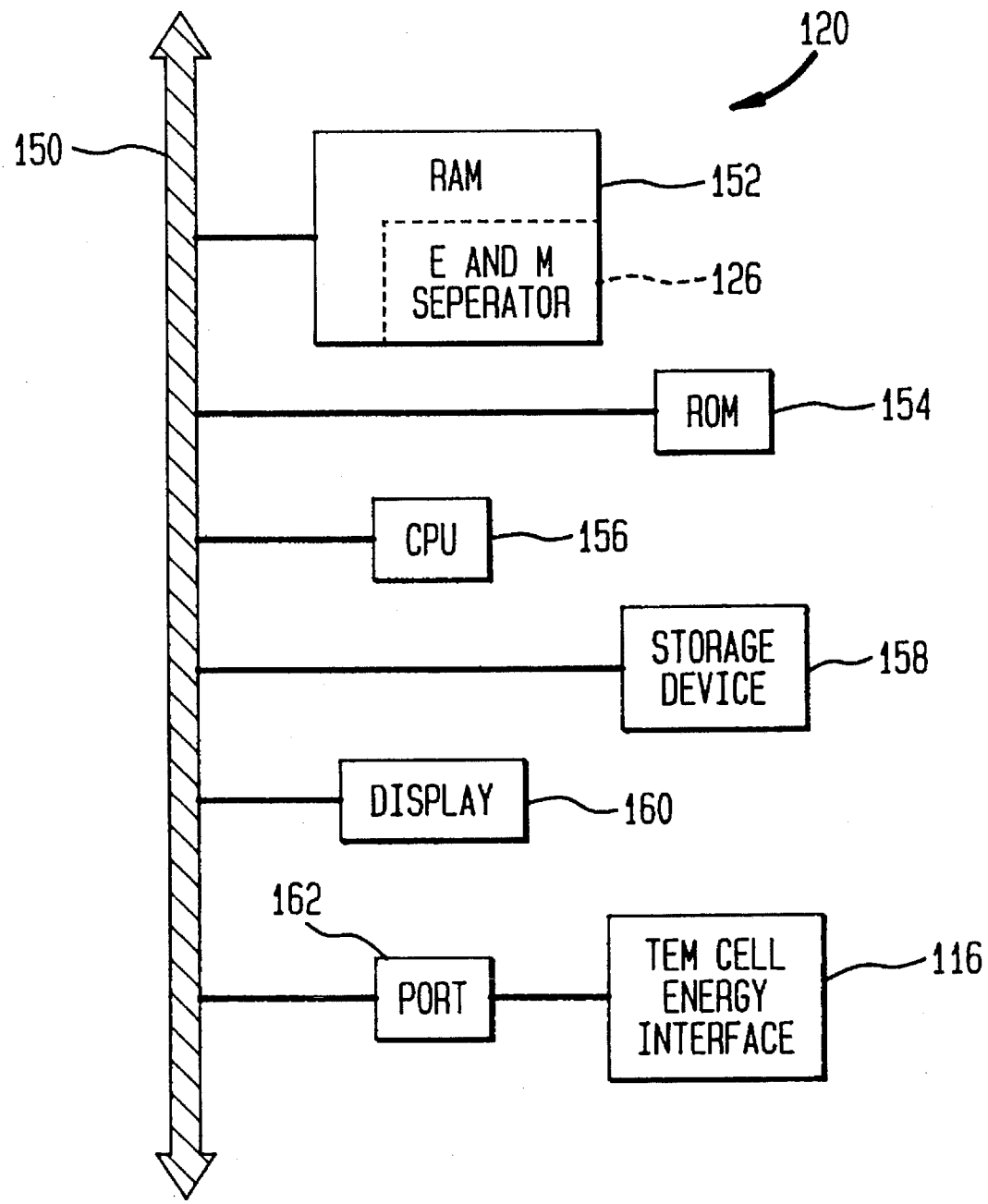
FIG. 1b is a block diagram of a computer as envisioned by various embodiments of the present invention.

The present invention relates to a system and method for making electromagnetic measurements of a test object (also known as equipment under test (EUT)) using a transverse electromagnetic (TEM) cell. More specifically, the present invention relates to a system and method for maintaining the EUT in a fixed tilt position and, as contemplated by various embodiments, a horizontal (i.e., "gravity-down") position as the TEM cell is tilted and EUT rotated to specified angles. The electromagnetic measurements taken at those angles are then processed to determine the electric field and the magnetic field produced by the EUT.

Through the present invention, improved readings of the electromagnetic field of an EUT can be obtained by tilting the TEM cell to at least two different angles and taking electromagnetic measurements at those angles. Embodiments of the present invention contemplate schemes for receiving electromagnetic information from the TEM cell and determining the electric field and magnetic field. The requirements of these schemes (and the various advantages thereof) determine the angles of tilt and rotation of the TEM cell and EUT, respectively. These schemes contemplate that the EUT is maintained in the gravity-down position (or at least in a fixed position relative to the tilt of the TEM cell) during the recording of these readings. Consequently, the present invention also contemplates a fixed tilt mechanism for maintaining the EUT in a specified fixed position while the TEM cell is tilted to various angles.

General embodiments of the present invention (as well as surrounding environments thereof) are now described with regard to FIG. 1a. Referring to FIG. 1a, a TEM cell 102 is shown suspended on two supports 112. The material of the TEM cell should comprise a good conducting material, so that it can act as a coaxial cable as described above. Embodiments of the present invention contemplate that the TEM cell can be suspended by any number of means, including those that would suspend it from the sides and/or the top of the cell. Various different sizes and shapes of the cell are also contemplated, some of which will be discussed below. Moreover, any other electromagnetic test cell using transmission line concepts (i.e., other than a TEM cell) is also contemplated by the present invention.

As shown, the TEM cell 102 can be tilted (i.e., rotated) about an axis 110. In this Figure, the axis 110 is perpendicular to the length of the TEM cell 102. However, the present invention contemplates that the axis can be positioned at any number of angles as well. Embodiments of the present invention contemplate that the axis is a horizontal axis (with regard to the ground upon which the TEM cell 102 is positioned), although tilting among multiple axes is also contemplated.

Within the TEM cell is a fixed tilt mechanism 104. The fixed tilt mechanism comprises a table 106, support structure 108 and hinges 107. When the TEM cell is tilted about axis 110, the table 106 tilts a corresponding amount about an axis 122 in the opposite direction, thus maintaining a specified fixed position (typically, a "gravity-down" position). Various embodiments of the present invention also contemplate that the table 106 is rotatable about an axis 124.

During the testing of an EUT, the EUT is placed upon table 106. The TEM cell is then tilted and the table 106 rotated to various positions as will be described further below. At each of these positions, embodiments of the present invention contemplate that the electromagnetic energy from the EUT is conducted by the TEM cell 102 down to a wire 114 and into a TEM cell energy interface 116. Basically, it is contemplated that the TEM cell energy interface 116 is some type of mechanism for converting energy in analog form (e.g., voltage) into a digital output that can be interpreted by a digital device.

Various embodiments of the present invention contemplate that the TEM cell energy interface 116 comprises a spectrum analyzer for reading only certain designated frequencies of the received energy. Embodiments of the present invention contemplate that those frequencies selected are the ones having the greatest power level, although other frequencies can be selected for various reasons as well. A general purpose instrument bus interface (GPIB) is then used between the spectrum analyzer and the digital device. Various embodiments contemplate that the spectrum analyzer is a model 8568B from Hewlett Packard of Palo Alto, Calif., and that the GPIB is a "GPIB-AT" from National Instruments of Austin, Tex. Of course, any number of other devices from other specific devices could be used as well. In addition, devices such as RF power meters or RF volt meters could be used in lieu of a spectrum analyzer.

As indicated above, the digitized reading of the energy level received from the TEM is then received via line 118 to a computer 120. An E and M separator 126 then determines how much of the energy received from the TEM is caused by the electric field and how much is caused by the magnetic field of the EUT. It is contemplated that the results are determined as electric and magnetic dipole moments. Embodiments of the present invention contemplate that E and M separator contains the set of angles that TEM 102 and table 106 should be tilted and rotated to, respectively. Examples of the E and M separator 126 as contemplated by various embodiments of the present invention will be described further below.

An example of computer 120 as contemplated by embodiments of the present invention is shown with regard to FIG. 1b. Referring now to FIG. 1b, a bus 150 is shown as the backbone connecting various components. The bus could use any number of standard architectures, including ISA, EISA, Microchannel, PCMCIA, etc.

A Random Access Memory (RAM) 152 is shown containing within it the E and M separator 126. It can also contain any electromagnetic information received from TEM cell 102. It should be understood that the RAM could be any other type of memory for storing information, including SRAM, Flash memory, magnetic, optical or atomic memory, or any combination thereof. A Read Only Memory (ROM) 154 is also shown, and can also contain E and M separator 126 or portions thereof. ROM 154 can be a conventional ROM, EPROM, EEPROM, etc.

A Central Processing Unit 156 executes various functions contemplated by embodiments of the present invention (e.g., various aspects of the E and M separator 126). The CPU can be any number of CPUs such as a Pentium from Intel Corporation of Santa Clara, Calif. or 68000 series from Motorola of Schaumburg, Ill. It can also be multiple CPUs tied together in a parallel processing configuration.

Storage device 158 can be any type of mass storage device for storing information, including magnetic, optical or atomic storage devices, and can store all or portions of E and M separator 126 as well as any electromagnetic information received from TEM cell 102. In essence, any information retention device such as the RAM 152, ROM 154 and/or storage device 158 can store all or portions of E and M separator 126 as well as act as a measurement storage mechanism.

Display 160 can be used for any number of purposes, including reviewing the results of the electric and magnetic field tests in numeric or graphical form, or reviewing the raw results obtained from the TEM 102. The display 160 can be any device capable of displaying such information, including a CRT, flat panel display, or even a printer. A port 162 is also shown for interfacing the TEM cell energy interface 116 with the rest of computer 120. Thus, the port 162 acts as an information reception mechanism for receiving the electromagnetic measurements.

In general, computer 120 can comprise any number of different types of computers, including micro, mini, and mainframe. In addition, the present invention also contemplates embodiments where two or more such computers are networked together.

Figure 3:
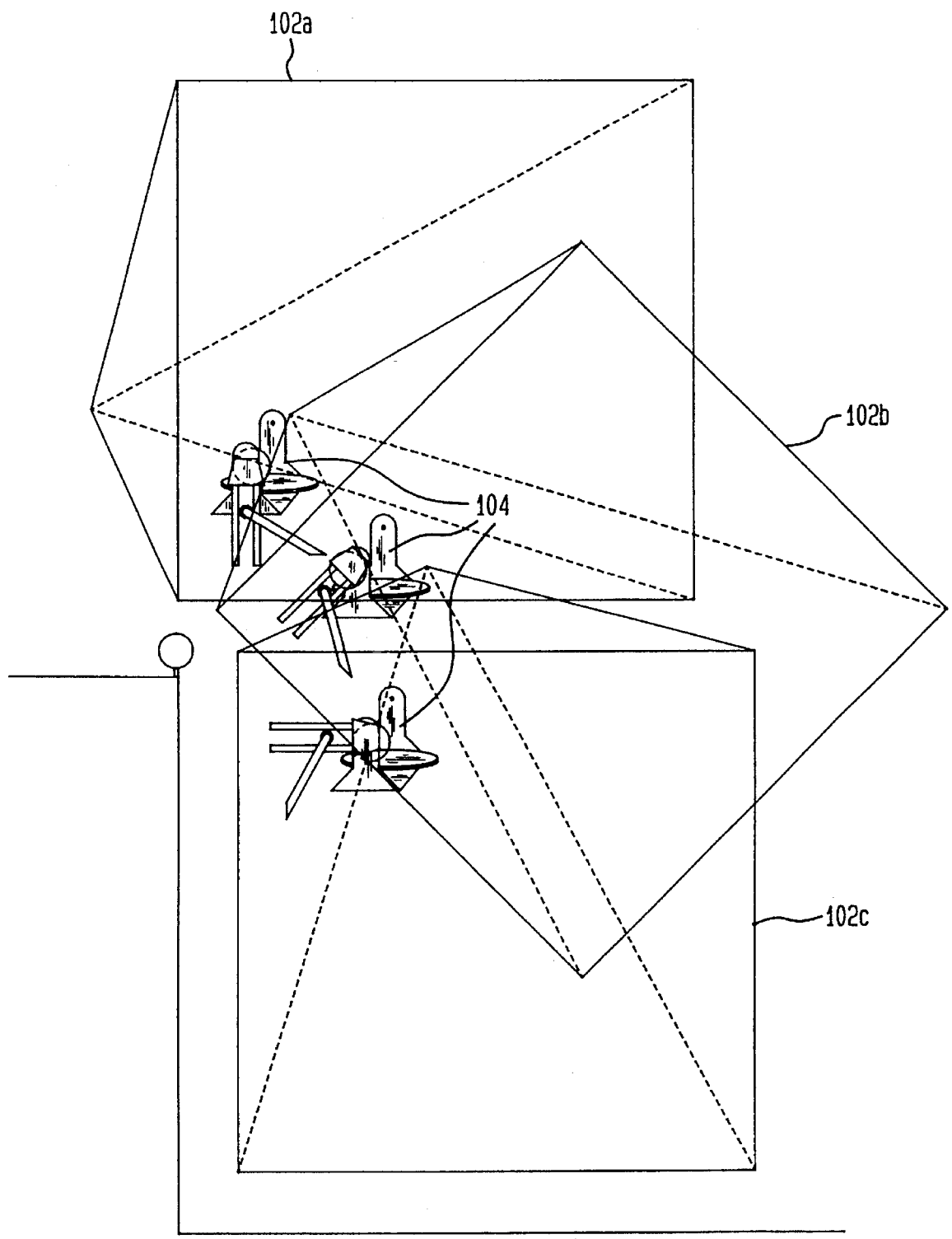
FIG. 3 is a second view of the TEM cell as tilted about an axis through three different angles.

Examples of the configuration and tilting angles of the TEM cell 102 as envisioned by various embodiments of the present invention (and surrounding environments thereof) are now described with regard to FIGS. 2 and 3. Referring first to FIG. 2, the TEM cell 102 is shown at three different positions as 102a, 102b and 102c. As can be seen, the TEM cell 102 is pyramidal in shape (which helps reduce unwanted RF reflections), with the fixed tilt mechanism 104 residing inside. It should be noted that the relative size of the fixed tilt mechanism 104 will be determined by a number of factors, including the size of the EUTs that are contemplated to be tested.

Regarding the tilting of the TEM cell, FIG. 2 shows how the TEM cell can be tilted to various angles L (about axis 110 as shown in FIG. 1a). The three angles shown in this example by TEM cells 102a-c are 0, 45 and 90 degrees off the horizontal, respectively. Of course, any number of different angles are contemplated. Also, embodiments of the present invention contemplate that the table portion of fixed tilt mechanism 104 is rotatable about an axis T (corresponding to axis 124 of FIG. 1a).

FIG. 3 depicts the tilting motion of TEM cell 102 from a different angle from that shown by FIG. 2. Referring to FIG. 3, the tilting of TEM cell 102 is viewed facing the base when the TEM cell 102 is at the various angles 0-90 degrees as depicted by TEM cells 102a-c.

Figure 4A:
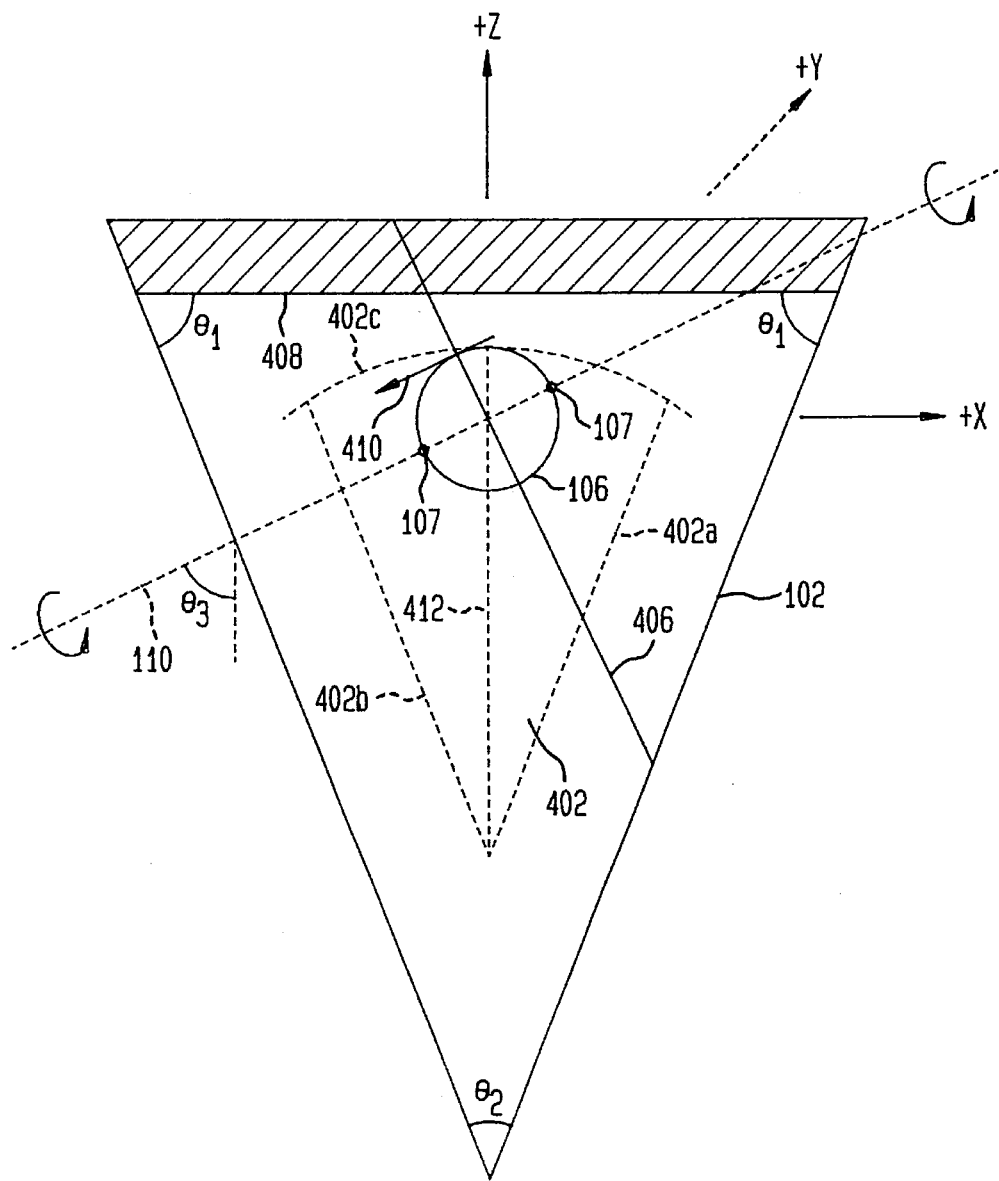
FIG. 4a is a view of the TEM cell depicting various features as contemplated by embodiments of the present invention and environments thereof.

Additional and specific descriptions of various embodiments of the present invention (and surrounding environments thereof) are now set forth with regard to FIG. 4a. Referring now to FIG. 4a, this Figure depicts a top-down view of the TEM cell 102 when no tilting of the TEM cell 102 has occurred (i.e., when the angle is at 0 degrees). That is, the TEM cell 102 is positioned at 0 degrees as shown by TEM cell 102a of FIGS. 2 and 3, and the view is from looking down through the "top" of the TEM cell 102a. Thus, the surface of the table 106 can be seen. The coordinates X, Y and Z are shown relative to this position of the TEM cell. Note that coordinate "Y" is in a direction passing directly through the top and center of the table 106.

If the TEM cell 102 were tilted 90 degrees as shown by TEM cell 102 of FIGS. 2 and 3, then looking through that same part of the TEM cell 102c as was viewed previously (which has now become a "side" of the TEM cell 102 by virtue of the tilting) would reveal only the side of the table 106. This is because the table 106 stayed in the fixed position due to hinges 107, and the TEM cell 102 has tilted about it.

In the embodiments shown by FIG. 4a, the TEM cell 102 is tiltable about axis 110, which in these embodiments is shown to be at an angle theta 3 off the centerline 412 of the TEM cell 102. Various embodiments of the present invention contemplate that theta 3 is 45 degrees. It is desirable that the angle theta 3 (as well as other dimensions of various other aspects of the invention) be set so as to reduce the complexity of ultimately determine the magnetic and electric fields of the EUT. Some embodiments of the invention contemplate using a model 1750 TEM cell from EMCO. Of course, the present invention contemplates various other TEM cells as well.

Some embodiments of the present invention contemplate using an absorber 408. The purpose of the absorber 408 is to help prevent unwanted RF reflections. The absorber 408 can be effectively used in conjunction with a pyramid-shaped TEM cell 102 mentioned above.

When using a TEM cell to analyze electromagnetic radiation, it has been found that there is a certain area within the TEM cell 102 that the EUT should remain within for accurate readings to be obtained. The dimensions of this area, often referred to as the "ideal test volume," depend upon a number of factors, including the size and shape of the TEM cell 102 itself. In FIG. 4a, the ideal test volume for TEM cell 102 is shown as the area within dashed lines 402a, 402b and 402c. This ideal test volume is further positioned within a certain distance from the "top" and "bottom" of the TEM cell 102 of FIG. 4a.

Figure 4B:
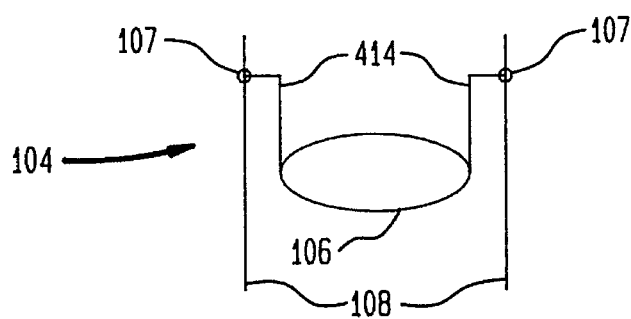
FIG. 4b is a general depiction of the fixed tilt mechanism as contemplated by various embodiments of the present invention.

Some embodiments of the present invention contemplate that the hinges 107 of the fixed tilt mechanism 104 are designed in such a way that the table 106 actually hangs down a certain length from the hinges themselves. Such an embodiment is shown by FIG. 4b. Referring to FIG. 4b, table supports 414 connect the table 106 to the hinges 107. Various mechanisms that affect the motion of the table 106 can then be advantageously placed within these table supports 414. Some of these mechanisms will be described below.

Certain embodiments of the present invention contemplate that the table 106 should be placed relatively close to the "base" of the ideal test volume (i.e., it should be placed close to dashed line 402c). Due to the pyramid shape of the ideal test volume, this placement allows larger EUTs to be accurately tested than would otherwise be possible. However, when embodiments such as that depicted by FIG. 4b are used, tilting the TEM cell 102 causes the table 106 to fall outside the ideal test volume due to the fact that the table 106 "hangs down" somewhat from the hinges 107 by virtue of the table supports 414.

To alleviate the problem mentioned above, various embodiments of the present invention provide that the table 106 can shift laterally as the TEM cell 102 is tilted in order to keep the table 106 (and thus, the EUT) within the ideal test volume. Referring back to FIG. 4a, an example of this lateral movement is depicted by arrow 410. Specifically, in this embodiment, as the TEM cell is tilted from 0 degrees, the table 106 is "shifted" in a direction parallel to axis 110 in the direction of arrow 410. When the TEM cell 102 is tilted back to 0 degrees, the table 106 is shifted back the other way. Some specific embodiments for implementing this will be described below. Of course, it should be understood that the table 106 can be shifted in any direction in response to the tilting of the TEM cell 102 for any number of reasons, including keeping the table within the ideal test volume. Further, the "shift" need not be entirely lateral.

Figure 5:
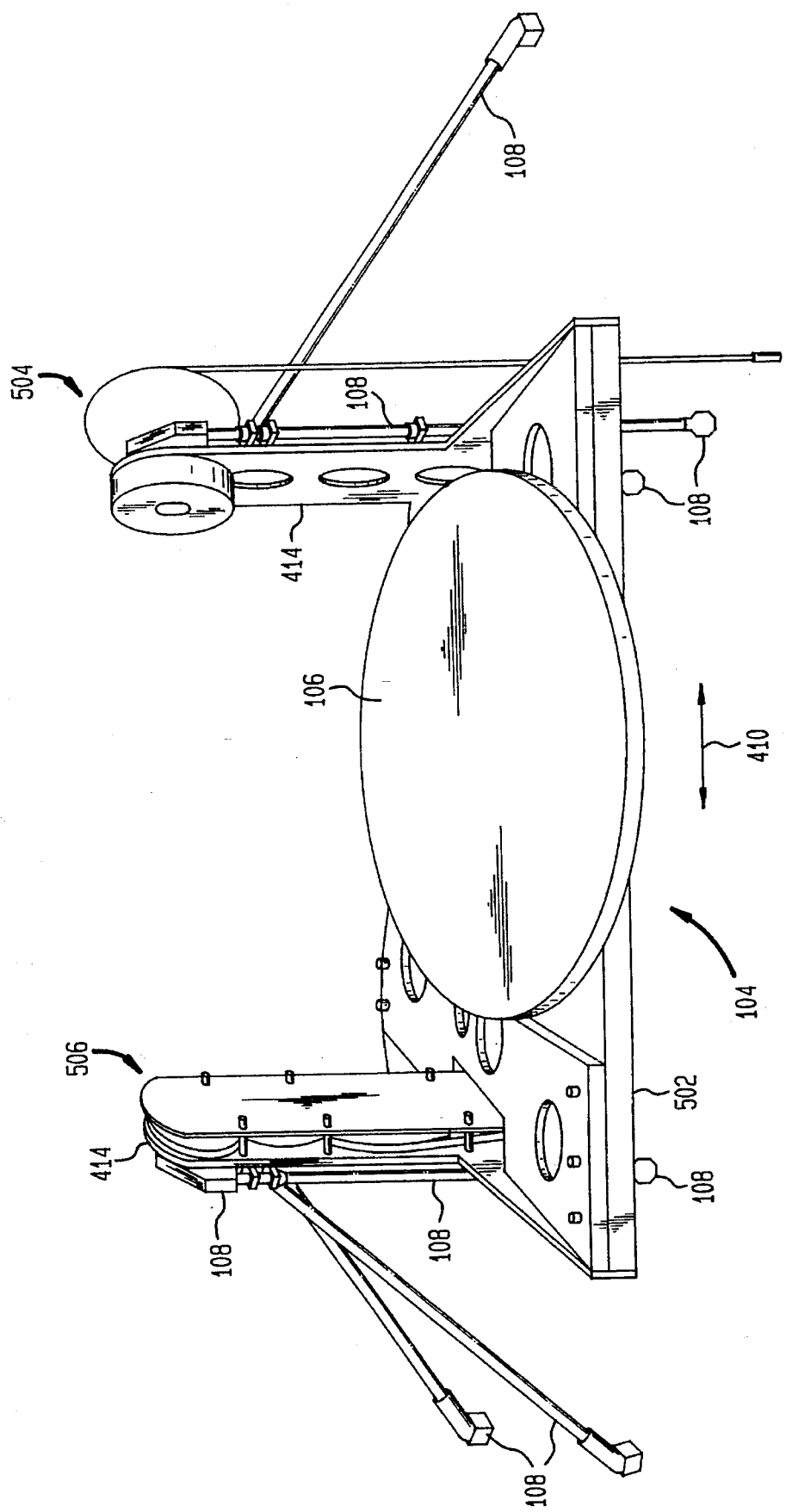
FIG. 5 is a view depicting various features of the fixed tilt mechanism as contemplated by various embodiments of the present invention.

Some specific examples of fixed tilt mechanism 104 as contemplated by various embodiments of the present invention are now described with regard to FIGS. 5-9. Referring first to FIG. 5, table 106 is shown as being set atop a cradle 502. Table supports 414 are part of the cradle, as shown, and serve to connect the rest of the cradle to support structure 108 in a hinged fashion. In this way, the cradle 502 can swing movably relative to the support structure 108 via hinges 107 (not shown in this Figure). It is contemplated that support structure 108 is attached at its base to the "floor" of TEM cell 102 (i.e., the bottom part of the TEM cell 102 when its angle is at 0 degrees).

Various embodiments contemplated by the present invention and shown by FIG. 5 include a drive mechanism 504 and a turn ratio converter 506. The drive mechanism 504 maintains the table 106 in a specified fixed position as the TEM cell 102 is tilted. The turn ratio converter 506 can shift the table 106 laterally in the directions shown by arrow 410 (although other directions are also contemplated) to keep the EUT within the ideal test volume, as described above. Embodiments of these two mechanisms 504 and 506 will be described in greater detail below. The present invention also contemplates that a motor (not shown) is used to rotate the table 106 to various selected positions.

Figure 6:
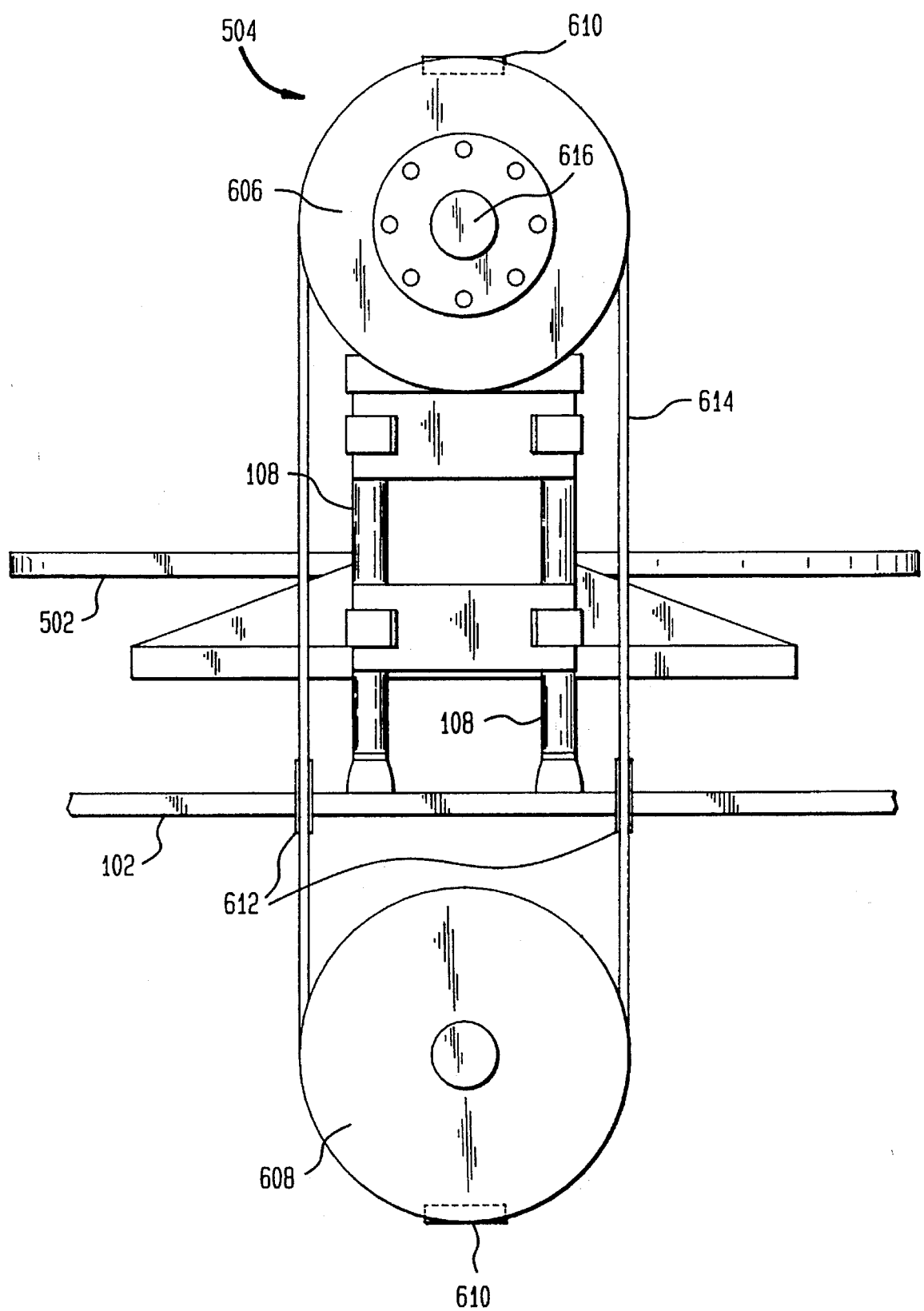
FIG. 6 is a first view of the drive mechanism of the fixed tilt mechanism as contemplated by various embodiments of the present invention.

FIG. 6 is a side view of the drive mechanism 504. Referring to FIG. 6, a top drive wheel 606 is fastened to a drivewheel axle 616, which in turn is fastened to cradle 502 (as will be shown in FIG. 7). Drivewheel axle 616 is positioned through support structure 108, and is free to rotate about it. Consequently, rotation of top drive wheel 606 causes cradle 502 to rotate in a corresponding fashion.

A drive belt 614 attaches top drive wheel 606 to a bottom drive wheel 608, and clamps 610 prevent the drive belt 614 from slipping as a force is exerted by the drive belt 614 onto the two drive wheels 606 and 608. As can be seen, the drive belt 614 passes through the "floor" of the TEM cell 102 via tubes 612. Embodiments of the present invention contemplate that bottom drive wheel 608 is fixed in place and does not rotate relative to the tilting of TEM cell 102. Consequently, as the TEM cell 102 is tilted, the cradle 502 is prevented from tilting. In this way, table 106 can maintain its fixed position irrespective of the angle that TEM cell 102 is tilted. Of course, it should be understood that bottom drive wheel 608 may be rotated somewhat for specific purposes such as initial adjustments.

Figure 7:
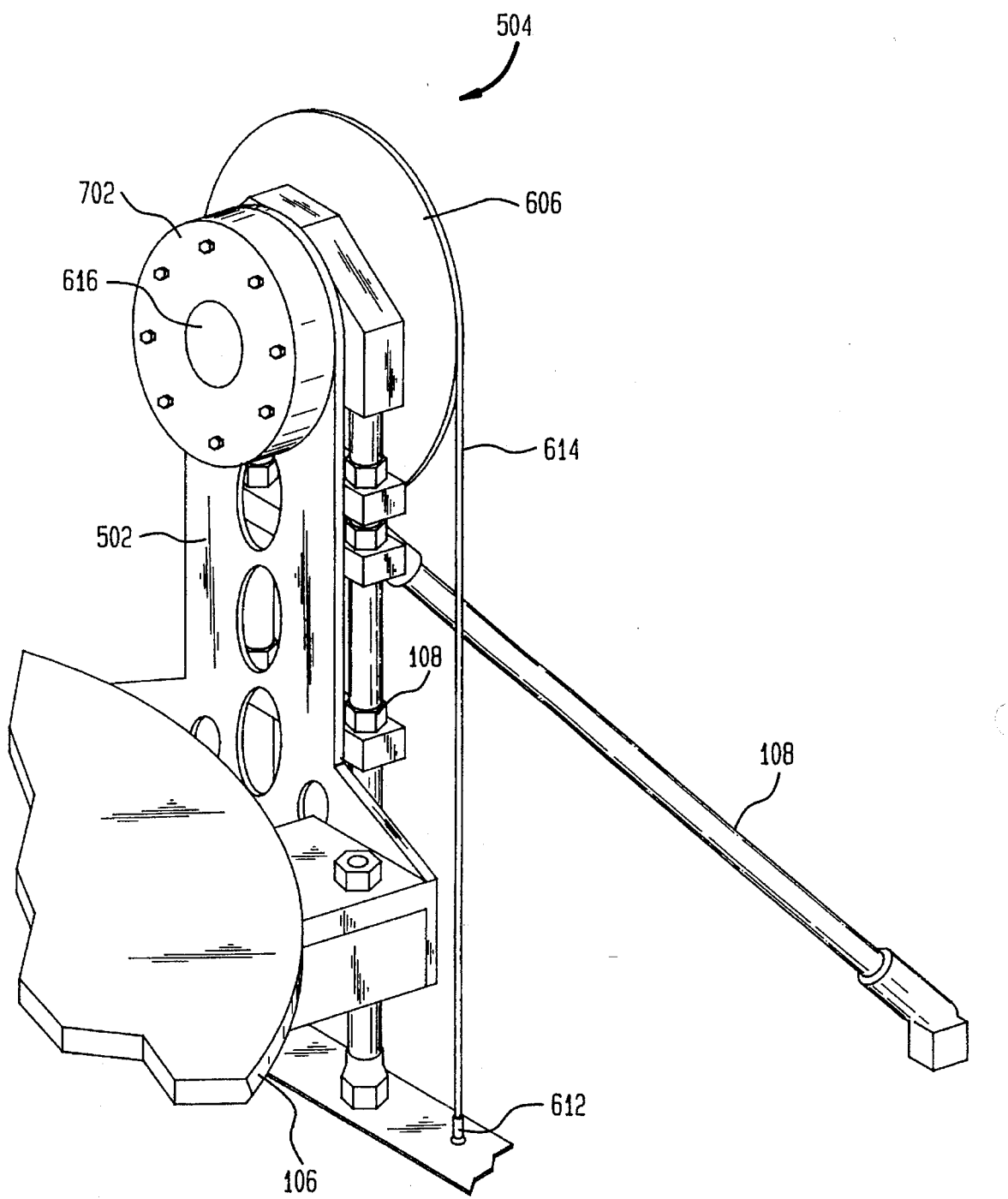
FIG. 7 is a second view of the drive mechanism of the fixed tilt mechanism as contemplated by various embodiments of the present invention.

Another view of drive mechanism 504 is shown in FIG. 7. Referring now to FIG. 7, drivewheel axle 616 is attached to cradle 502 via an axle attachment 702. In this way, rotation of axle 616 causes rotation of cradle 502.

Of course, it should be understood that the embodiments of drive mechanism 504 shown by FIGS. 5–7 are by way of example, and that the present invention contemplates any number of mechanisms for maintaining table 106 in a fixed tilt position as the TEM cell 102 is tilted.

Figure 8:
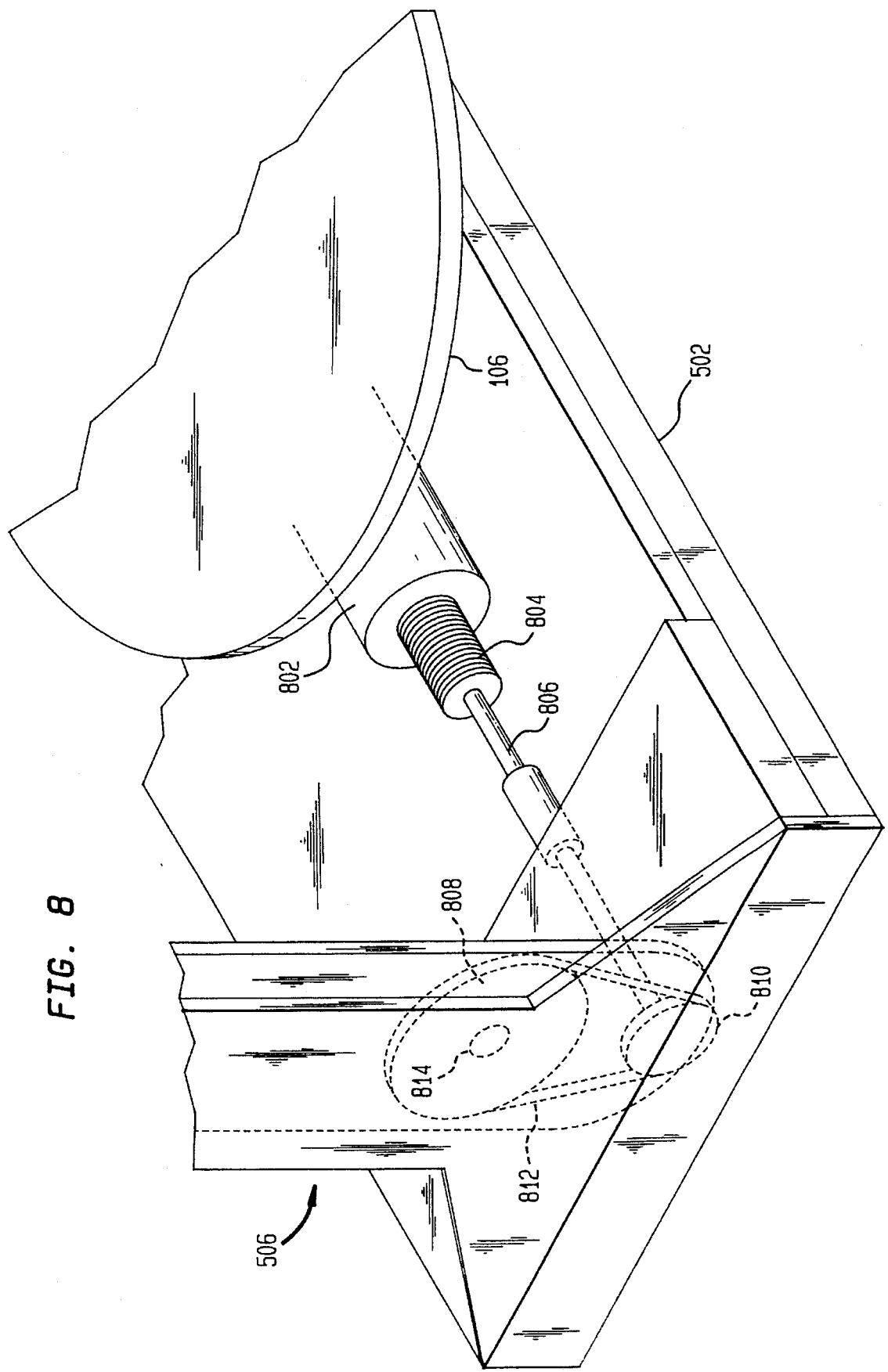
FIG. 8 is a first view of the turn ratio converter of the fixed tilt mechanism as contemplated by various embodiments of the present invention.

A portion of the turn ratio converter 506 is shown at FIG. 8. Referring to FIG. 8, a sliding tube 802 is envisioned to be attached to table 106 such that by moving the sliding tube 802, the table 106 will also move a corresponding amount. One embodiment envisioned for implementing this while also allowing the table 106 to freely rotate is to place table 106 on a movable, wheeled carriage (not shown) which rests on cradle 502. Table 106 is then free to rotate about the wheeled carriage. The sliding tube 802 would be attached to the wheeled carriage such that by moving the sliding tube 802, the table 106 would move accordingly in a lateral manner.

Sliding tube 802 is envisioned to have a hollow threaded core into which a threaded rod 804 can be rotatably inserted. A shaft 806 connects the threaded rod 804 with first small pulley wheel 810. Thus, rotation of the first small pulley wheel 810 causes threaded rod 804 to rotate, causing sliding tube 802 to either be pulled toward first small pulley wheel 810 or pushed away from it, depending upon the direction of rotation and the orientation of the threading on threaded rod 804. This rotation, in turn, pushes or pulls table 106 laterally away from or toward first small pulley wheel 810.

A first large pulley wheel 808 is attached to first small pulley wheel 810 via a first belt 812. Because of the relative sizes of the two wheels 808 and 810, one revolution of first large pulley wheel 808 results in more than one revolution of first small pulley wheel 810. First large pulley wheel 808 is shown attached to a first pulley axis 814.

Figure 9:
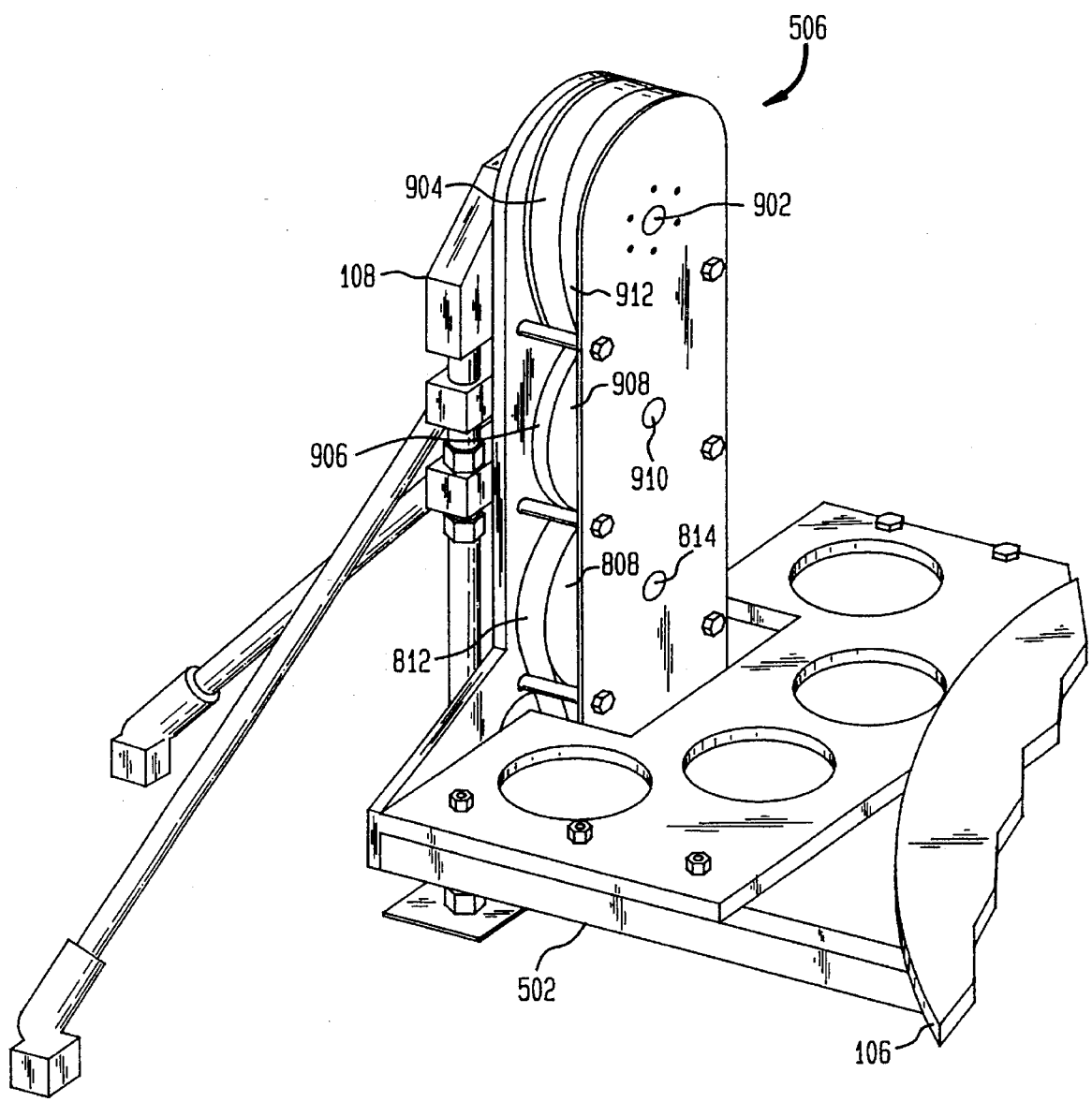
FIG. 9 is a second view of the turn ratio converter of the fixed tilt mechanism as contemplated by various embodiments of the present invention.

FIG. 9 shows an outer side portion of the turn ratio converter 506. Referring now to FIG. 9, turn ratio converter 506 can be seen to be affixed to cradle 502. As can also be seen, a second large pulley wheel 908 is attached to first pulley axis 814 via a second belt 906. Again, because of relative size, one revolution of second large pulley wheel 908 results in more than one revolution of first pulley axis 814, and thus of first large pulley wheel 808. Second large pulley wheel 908 is shown attached to a second pulley axis 910.

Lastly, a third large pulley wheel 912 is attached to second pulley axis 910 via a third belt 904, with the same result as described above. The third large pulley wheel 912 is shown attached to a third pulley axis 902.

The third pulley axis 902 is attached to support structure 108. Thus, when the TEM cell 102 is tilted and the support structure 108 effectively rotates about cradle 502 due to drive mechanism 504 (which keeps the cradle 502 in the fixed position), the third pulley axis 902 causes third large pulley wheel 912 to turn. From the description of the various wheels and belts of turn ratio converter 506 mentioned above, it can be readily appreciated that a turn of the third pulley axis 902 translates into a much more than a single turn of shaft 806 in FIG. 8. In this way, tilting TEM cell 102 ultimately results in the lateral movement of table 106.

The amount of lateral movement that table 106 should be moved due to the tilting of the TEM cell 102 depends on a number of factors, including the size and shape of the ideal test volume, the position of the table 106 within the ideal test volume, and the anticipated size of prospective EUTs. Moreover, it should be understood that the present invention contemplates any number of other configurations for performing the function of the turn ratio converter 506 described above. That is, for example, other combinations of wheels and belts could be used, as well as gears rather than wheels. In general, any device that translates the tilting motion of the TEM cell 102 into a force for laterally moving table 106 as described above can be used.

The specific angles to which the TEM cell is tilted and table 106 rotated to take the readings for determining the electric and magnetic fields depends upon various factors. One example may include the desire to tilt the TEM cell by an amount that lessens the amount that any cables attached to the EUT might otherwise move. Another example may include a desire to take relatively few readings and/or simplify the calculations required to calculate the fields. In any event, it is the scheme for determining the fields from the readings received from the TEM cell that drives the angles that will be used. The present invention, generally, contemplates a variety of schemes for making such calculations for a TEM cell tilted to two or more different angles.

Figure 10:
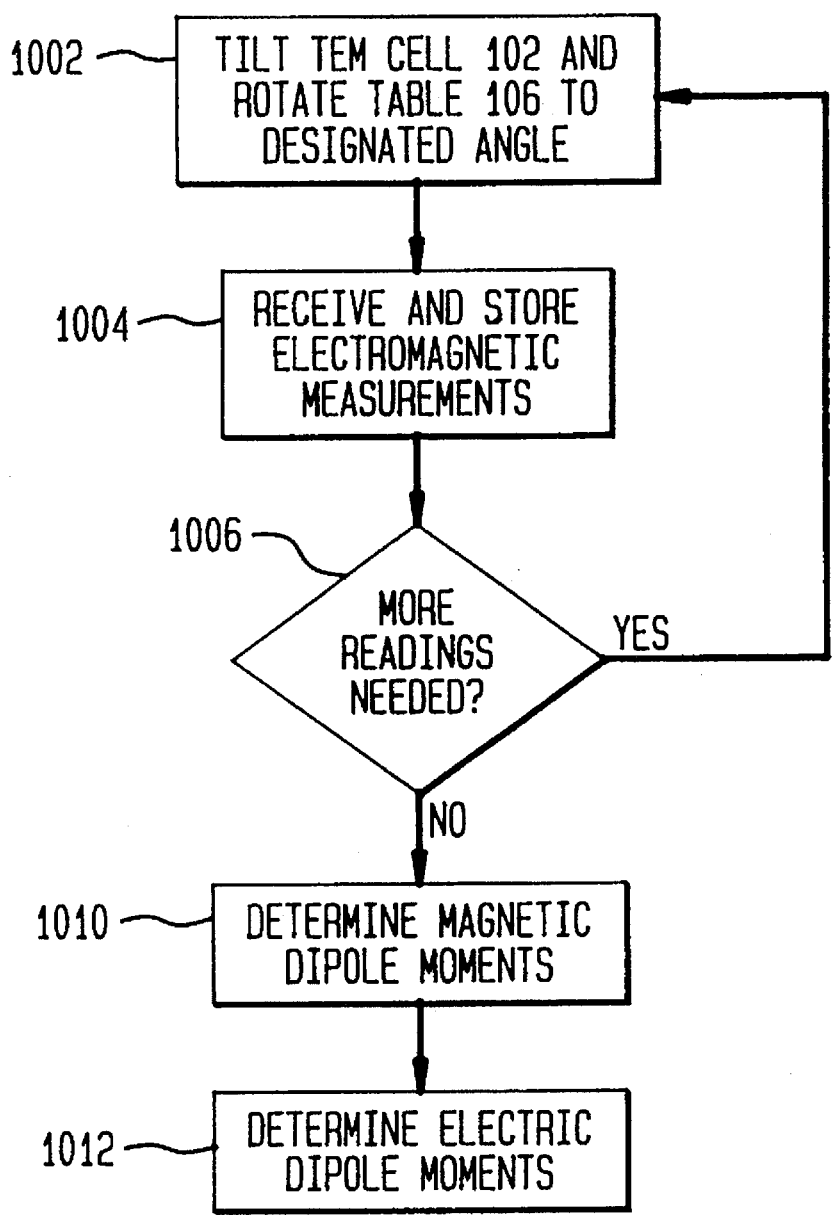
FIG. 10 is a flow diagram of a method contemplated by embodiments of the present invention concerning the determination of electric and magnetic fields of the Equipment Under Test.

Embodiments of a method of operation of the present invention concerning the determination of the electric and magnetic fields (and, particularly, electric and magnetic dipole moments) as contemplated by embodiments of the present invention (and, particularly, embodiments of E and M separator 126) are now shown with regard to the flowchart of FIG. 10. Referring now to FIG. 10, TEM cell 102 is tilted and table 106 rotated to a designated angle. This is indicated by a block 1002.

The electromagnetic measurement is then taken from the TEM cell 102 at the above-noted angle and is stored. This is indicated by a block 1004. Embodiments of the present invention contemplate that the reading can be stored in at least any of the various storage devices mentioned above with regard to FIG. 1b.

A determination is then made as to whether more readings need to be taken. This is indicated by decision block 1006. Various embodiments of the present invention contemplate that this determination is pre-set, and that a certain number of readings (using a set of tilt and rotation angles) will always be taken. Other embodiments contemplate that this determination is made based upon certain criteria, for example, whether degeneracies are present (as explained below). In any event, if more readings need to be taken, control proceeds with block 1002, and the TEM cell 102 is tilted and table 106 rotated to its next angles.

If no more readings are needed, then the stored information is used to determine the magnetic dipole moments. This is indicated by a block 1010. The electric dipole moments are also determined, as indicated by a block 1012.

Two specific examples of schemes (i.e., examples of embodiments of E and M separator 126 as shown in FIG. 1a) for calculating the electric and magnetic fields as contemplated by embodiments of the present invention are now described. In these two examples, the electric and magnetic dipole moments along the x, y and z axis are solved for. It should be understood, however, that the present invention also contemplates calculation of the magnetic and electric fields with respect to other coordinate systems as well.

The first example is now described. $\lambda$ is defined as the angle between the plane that passes through the center of the ideal test volume and a horizontal line that is perpendicular to the axis of cell rotation 110. $\lambda=0°$ is defined as the position where the plane passing through the center of the ideal test volume is horizontal. $\lambda$ can vary in this example from 0°, when the cell is horizontal, to 90°, when it is vertical. T is defined as the turntable position of table 106 in which the EUT +X axis is aligned transverse to the TEM cell 102 (i.e., the EUT +X axis is parallel with the direction of the +X axis as shown in FIG. 4a). T can be positioned from 0° to 360°. Thus, the coordinate system is the one shown and described with regard to FIG. 4a.

It can be shown that the equation for measured voltage at the TEM cell (e.g., the voltage received from wire 114 as shown in FIG. 1a) is:

$$|v^h_{normalized}|^2 = (P_y*\cos(\lambda) + P_x*\cos(T + 225°)*\sin(\lambda) +$$
$$P_z*\cos(T + 135°)*\sin(\lambda))^2 + (k_0(M_y*\sin(\lambda)*\cos(45°) +$$
$$M_x*(\sin(T + 45)/\sqrt{2} + \cos(T + 45)*\cos(\lambda)/\sqrt{2}) +$$
$$M_z*(\sin(T - 45)/\sqrt{2} + \cos(T - 45)*\cos(\lambda)/\sqrt{2})))^2$$

Note that the voltage represents the combined effects of the magnetic and electric fields produced by the EUT. Thus, the present invention must now sort out how much each field contributed to the voltage. By "normalized" in $v^h_{normalized}$, the voltage is adjusted to take such factors as the size of the TEM cell and the distance for which the fields are being tested. To help implement this normalization, reference can be made to the National Bureau of Standards technical notes 1013, 1017, 1040 and 1064 from the U.S. Department of Commerce. It should be understood that the present invention also contemplates embodiments where measurements other than voltage, such as "power," could be looked at.

The $k_0$ in the equation refers to a constant known as a "wave number" that varies with the frequencies of the EUT being analyzed.

To solve for the three electric dipole moments and three magnetic dipole moments, seven non-zero readings are required. To insure that this condition is met (in the event that degeneracies are encountered as explained below) a set of nine readings will be defined.

For the following readings of the EUT taken at the angles of the TEM 102 and table 106 set forth below, the generalized voltage equation given above reduces to the following:

MEASUREMENT 1: $\lambda=0°$ and $T=0°$ $$S_1=|P_y^2+k_0^2*M_x^2|$$

MEASUREMENT 2: $\lambda=0°$ and $T=90°$ $$S_2=|P_y^2+k_0^2*M_z^2|$$

MEASUREMENT 3: $\lambda=0°$ and $T=+45°$ $$S_3=|P_y^2+\tfrac{1}{2}*k_0^2*M_x^2+\tfrac{1}{2}*k_0^2*M_z^2+k_0^2*M_x*M_z|$$

MEASUREMENT 4: $\lambda=0°$ and $T=-45°$ $$S_4=|P_y^2+\tfrac{1}{2}*k_0^2*M_x^2+\tfrac{1}{2}*k_0^2*M_z^2-k_0^2*M_x*M_z|$$

MEASUREMENT 5: $\lambda=90°$ and $T=+135°$ $$S_5=|P_x^2+\tfrac{1}{2}*k_0^2*M_y^2+\tfrac{1}{2}*k_0^2*M_z^2+k_0^2*M_y*M_z|$$

MEASUREMENT 6: $\lambda=90°$ and $T=-45°$ $$S_6=|P_x^2+\tfrac{1}{2}*k_0^2*M_y^2+\tfrac{1}{2}*k_0^2*M_z^2-k_0^2*M_y*M_z|$$

MEASUREMENT 7: $\lambda=90°$ and $T=-135°$ $$S_7=|P_z^2+\tfrac{1}{2}*k_0^2*M_y^2+\tfrac{1}{2}*k_0^2*M_x^2-k_0^2*M_y*M_x|$$

MEASUREMENT 8: $\lambda=90°$ and $T=+45°$ $$S_8=|P_x^2+\tfrac{1}{2}*k_0^2*M_y^2+\tfrac{1}{2}*k_0^2*M_x^2+k_0^2*M_y*M_x|$$

MEASUREMENT 9: $\lambda=45°$ and $T=+9.74°$ $$S_9 = |1\tfrac{1}{2}*P_y^2 + \tfrac{1}{2}*P_x^2 + P_y*P_x + \tfrac{1}{4}*k_0^2*M_y^2 +$$
$$\tfrac{1}{4}*k_0^2*M_x^2 + \tfrac{1}{2}*k_0^2*M_z^2 - \tfrac{1}{2}*k_0^2*M_y*M_x +$$
$$1/\sqrt{2}*k_0^2*M_z*M_y - 1/\sqrt{2}*k_0^2*M_z*M_x|$$

Which for the case of $M_z$ and $M_x \rightarrow 0$ reduces to:

$$S_9=|1\tfrac{1}{2}*P_y^2+\tfrac{1}{2}*P_x^2+P_y*P_x+\tfrac{1}{4}*k_0^2*M_y^2|$$

From these readings, solutions may be derived for the six dipole moments in the following manner, using 7 of the readings obtained above:

$$D_1=S_3-S_4=|2*k_0^2*M_x*M_z|$$
$$D_2=S_5-S_6=|2*k_0^2*M_y*M_z|$$
$$D_3=S_7-S_8=|2*k_0^2*M_y*M_x|$$

Disallowing degeneracies, the magnetic dipole moments can be derived as follows:

$$M_x=((D_1*D_3)/(2*k_0^2*D_2))^{1/2}$$
$$M_y=((D_2*D_3)/(2*k_0^2*D_1))^{1/2}$$
$$M_z=((D_1*D_2)/(2*k_0^2*D_3))^{1/2}$$

The electric dipole moments can then be solved for as follows:

$$P_y=(S_1-k_0^2*M_x^2)^{1/2}$$
$$P_x=(S_5-[\tfrac{1}{2}*k_0^2*M_y^2+\tfrac{1}{2}*k_0^2*M_z^2+k_0^2*M_y*M_z])^{1/2}$$
$$P_z=(S_8-[\tfrac{1}{2}*k_0^2*M_y^2+\tfrac{1}{2}*k_0^2*M_x^2+k_0^2*M_y*M_x])^{1/2}$$

The solution presented about requires that no degeneracies are present (i.e., none of the readings tend to zero as compared with the other readings). Embodiments of the present invention contemplate that a "degeneracy" exists if any reading is less than 10 percent of the largest reading. If this is the case, then one of two approaches must be used.

The EUT may be reoriented relative to its coordinate system and the readings retaken until a set of readings is found having no degeneracies. The other approach is to use the following additional steps.

As an example, if $D_1$ is degenerate, then one of three cases must exist:

1. $M_x \ll$ Maximum.
2. $M_z \ll$ Maximum.
3. $M_x$ and $M_z \ll$ Maximum.

By forming the difference $$S_1-S_2=k_0^{2}*M_x^{2}-k_0^{2}*M_z^{2},$$

we can inspect the result and reach the following conclusions:

1. If the difference $\rightarrow 0$ then both $M_x$ and $M_z$ are small.

2. If the difference $<0$ then $M_x$ is small and $$-k_0^{2}*M_z^{2}\approx S_1-S_2.$$

3. If the difference $>0$ then $M_z$ is small and $$k_0^{2}*M_x^{2}\approx S_1-S_2.$$

If either $M_x$ or $M_z$ are non-degenerate then $M_y$ may be derived from $D_2$ or $D_3$ are follows:

$$M_y=D_2/(2*k_0*M_z) \text{ or } M_y=D_3/(2*k_0*M_x)$$

If both $M_x$ or $M_z$ are small then:

$$P_y^{2}\approx S_1\approx S_2\approx S_3\approx S_4$$

and the following equations reduce to:

$$S_5 \approx S_6 \approx |P_x^{2}+\frac{1}{2}*k_0^{2}*M_y^{2}|$$

and $$S_9 \approx |\frac{1}{2}*P_y^{2}+\frac{1}{2}*P_x^{2}+P_y*P_x+\frac{1}{4}*k_0^{2}*M_y^{2}|$$

It then follows that:

$$P_x=(S_9-\frac{1}{2}*S_5-\frac{1}{2}*P_y^{2})/P_y$$

and $$M_y \approx (2/k_0^{2}*(S_5-P_x^{2}))^{1/2}$$

The solution for the remaining electric dipole moments then follows directly from the original equations already mentioned above.

Various embodiments of the first example mentioned above also contemplate a scheme requiring utilization of only 6 measurements (e.g., MEASUREMENTS 3–8). To utilize an example of this implementation, the equation for $P_y$ would be substituted with the following:

$$P_y=(S_3-[\frac{1}{2}*k_0^{2}*M_x^{2}+\frac{1}{2}*k_0^{2}*M_z^{2}+k_0^{2}*M_x*M_z])^{1/2}$$

Figure 11A:
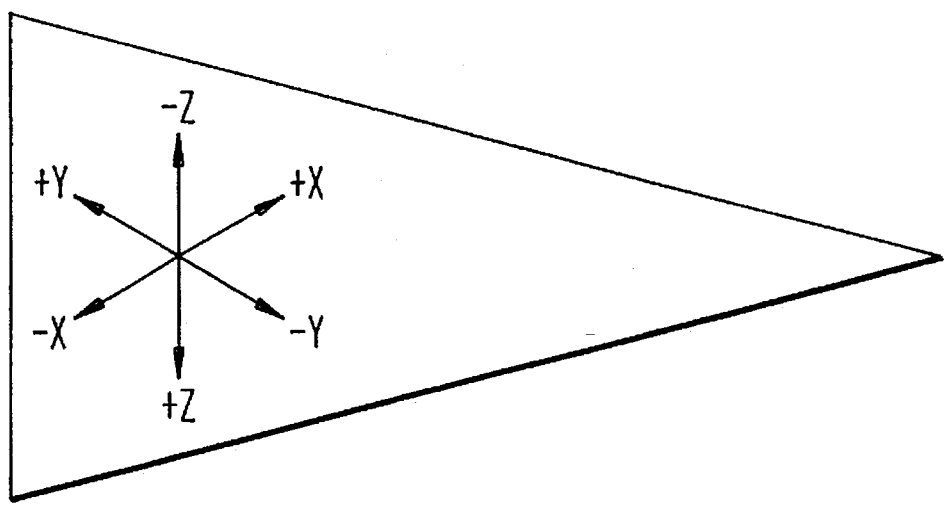
FIGS. 11a, 11b and 11c depict a coordinate system for use with various embodiments contemplated by the present invention.
Figure 11B:
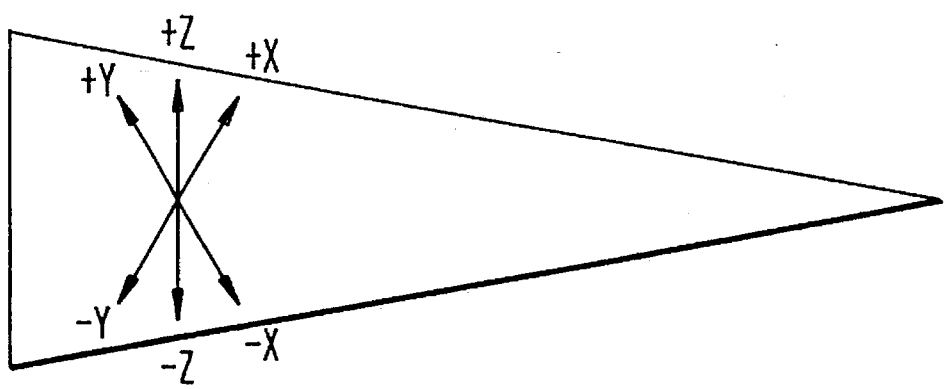
Figure 11C:
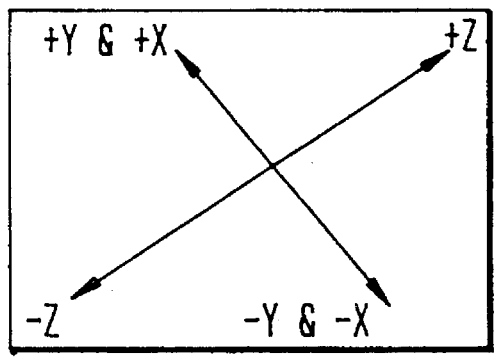
Figure 12A:
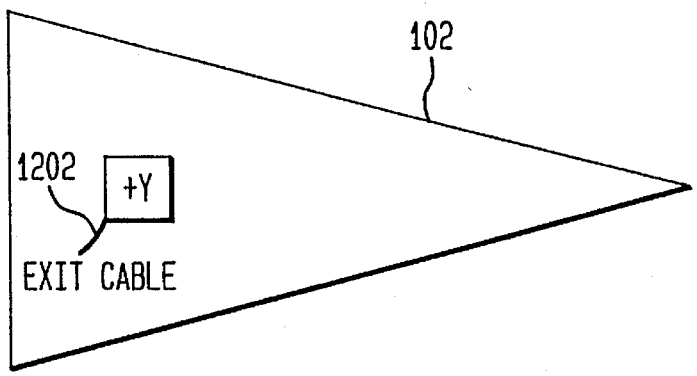
FIGS. 12a, 12b, 12c, 12d and 12e depict the effect of the present invention on cabling, as contemplated by first embodiments of the present invention.
Figure 12C:
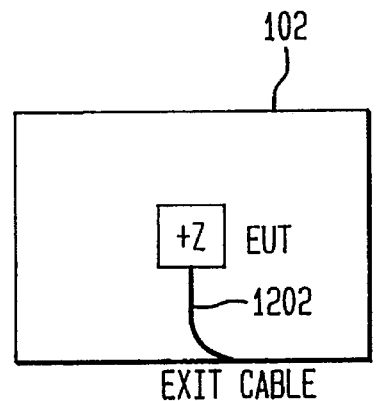
Figure 12B:
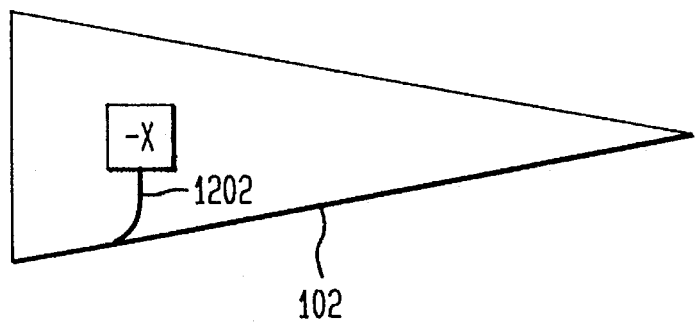
Figure 12D:
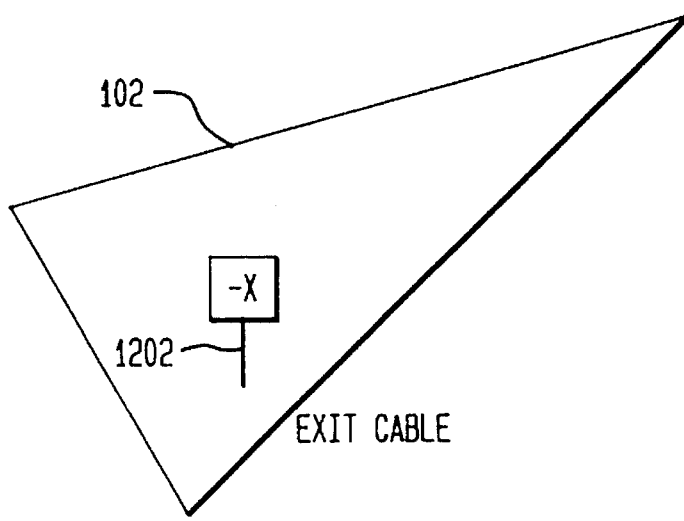
Figure 12E:
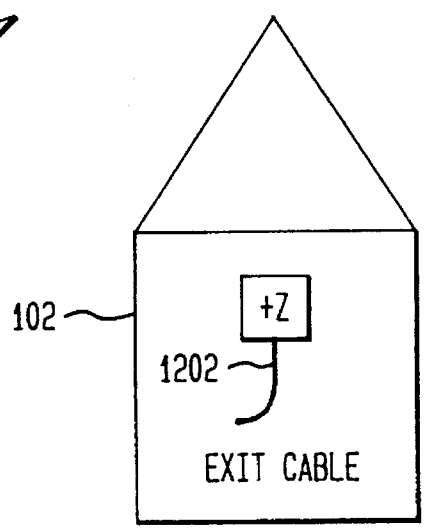

The second example contemplated by embodiments of the present invention is now described. In this application, the EUT frame of reference is arranged symmetrically around the horizontal plane, as indicated in FIGS. 11a, 11b and 11c. In this frame of reference +X, +Y and +Z are arranged symmetrically over horizontal. The negative end of the axes are below horizontal.

The cell may be tilted about an axis which is horizontal and oriented at 45 degrees off of the centerline. The tilt angle is defined as $\lambda$ with $\lambda=0$ being when the plane passing through the center of the ideal test volume in the cell is horizontal. The EUT may be turned on table 106 in the horizontal plane. The angle of rotation is T with T=0 being when the EUT is oriented with Z+ directly over the TEM cell 102 centerline 412.

With these reference designations, the following equation can be shown to describe the voltage measured at the tip of the TEM cell 102 (e.g., the voltage received from wire 114 as shown in FIG. 1a):

$$|v_{normalized}^{h}|^{2} = (P_y*(\cos(\lambda) - \sqrt{2}*\cos(T + 165°)*\sin(\lambda))/\sqrt{3} +$$
$$(P_x*(\cos(\lambda) - \sqrt{2}*\cos(T + 45°)*\sin(\lambda))/\sqrt{3} +$$
$$(P_z*(\cos(\lambda) - \sqrt{2}*\cos(T + 285°)*\sin(\lambda))/\sqrt{3})^{2} +$$
$$(k_0(M_y*(\sin(T + 165) + \sin(\lambda)/\sqrt{2} + \cos(T + 165)*\cos(\lambda))/\sqrt{3} +$$
$$M_x*(\sin(T + 45) + \sin(\lambda)/\sqrt{2} + \cos(T + 45)*\cos(\lambda))/\sqrt{3} +$$
$$M_z*(\sin(T + 285) + \sin(\lambda)/\sqrt{2} + \cos(T + 285)*\cos(\lambda))/\sqrt{3}))^{2}$$

In order to simplify the matrix operation contemplated by this example, this general equation can be expanded to separate the square terms and cross terms:

$$|v_{normalized}^{h}|^{2} = (P_y*(\cos(\lambda) - \sqrt{2}*\cos(T + 165°)*\sin(\lambda))/\sqrt{3})^{2} +$$
$$(P_x*(\cos(\lambda) - \sqrt{2}*\cos(T + 45°)*\sin(\lambda))/\sqrt{3})^{2} +$$
$$(P_x*(\cos(\lambda) - \sqrt{2}*\cos(T + 285°)*\sin(\lambda))/\sqrt{3})^{2} +$$
$$2*(P_y*(\cos(\lambda) - \sqrt{2}*\cos(T + 165°)*\sin(\lambda))/\sqrt{3}) *$$
$$(P_x*(\cos(\lambda) - \sqrt{2}*\cos(T + 45°)*\sin(\lambda))/\sqrt{3}) +$$
$$2*(P_y*(\cos(\lambda) - \sqrt{2}*\cos(T + 165°)*\sin(\lambda))/\sqrt{3}) *$$
$$(P_x*(\cos(\lambda) - \sqrt{2}*\cos(T + 285°)*\sin(\lambda))/\sqrt{3}) +$$
$$2*(P_x*(\cos(\lambda) - \sqrt{2}*\cos(T + 45°)*\sin(\lambda))/\sqrt{3}) *$$
$$(P_x*(\cos(\lambda) - \sqrt{2}*\cos(T + 285°)*\sin(\lambda))/\sqrt{3}) +$$
$$(k_0*M_y*(\sin(T + 165) + \sin(\lambda)/\sqrt{2} + \cos(T + 165)*\cos(\lambda))/\sqrt{3})^{2} +$$
$$(k_0*M_x*(\sin(T + 45) + \sin(\lambda)/\sqrt{2} + \cos(T + 45)*\cos(\lambda))/\sqrt{3})^{2} +$$
$$(k_0*M_z*(\sin(T + 285) + \sin(\lambda)/\sqrt{2} + \cos(T + 285)*\cos(\lambda))/\sqrt{3})^{2} +$$
$$2*(k_0*M_y*(\sin(T + 165) + \sin(\lambda)/\sqrt{2} + \cos(T + 165)*\cos(\lambda))/\sqrt{3}) *$$
$$(k_0*M_x*(\sin(T + 45) + \sin(\lambda)/\sqrt{2} + \cos(T + 45)*\cos(\lambda))/\sqrt{3}) +$$
$$2*(k_0*M_y*(\sin(T + 165) + \sin(\lambda)/\sqrt{2} + \cos(T + 165)*\cos(\lambda))/\sqrt{3}) *$$
$$(k_0*M_z*(\sin(T + 285) + \sin(\lambda)/\sqrt{2} + \cos(T + 285)*\cos(\lambda))/\sqrt{3}) +$$
$$2*(k_0*M_x*(\sin(T + 45) + \sin(\lambda)/\sqrt{2} + \cos(T + 45)*\cos(\lambda))/\sqrt{3}) *$$
$$(k_0*M_z*(\sin(T + 285) + \sin(\lambda)/\sqrt{2} + \cos(T + 285)*\cos(\lambda))/\sqrt{3})$$

To simplify the matrix operation, the cross terms are treated as separate variables and solved for separately. This approach requires taking electromagnetic measurements at 12 positions. While mathematically as few as 6 non-zero readings can be taken (and various embodiments contemplate that approach), taking the measurements at the 12 positions requires that the TEM cell 102 be tilted to a lesser extent, while still allowing accurate readings to be obtained.

In choosing a set of measurement points, it must be assured that the resulting readings can be accurately analyzed by the pertinent equations. The equation coefficients, amplitude of the emission and instrumentation sensitivity combine to set a criteria for the minimum spacing which may be used between positions and still yield accurate results. The coefficients for these points are then calculated and placed in a 12×12 matrix. The determinate of the matrix should be evaluated and verified that it is not zero.

An example using the following positions is now shown:

| λ | T |
|---|---|
| 54.736 | 15 |
| 54.736 | 135 |
| 54.736 | 255 |
| 64.736 | 75 |
| 64.736 | 195 |
| 64.736 | 315 |
| 44.736 | 15 |
| 44.736 | 135 |
| 44.736 | 255 |
| 44.736 | 75 |
| 44.736 | 195 |
| 44.736 | 315 |

Calculating the coefficients and fitting them into a matrix, M, results in the following:

$$M = \begin{pmatrix} P_y^2 & P_x^2 & P_z^2 & P_yP_x & P_yP_z & P_xP_z & M_y^2 & M_x^2 & M_z^2 & k_0M_yM_x & k_0M_yM_z & k_0M_xM_z \\ 1 & 0 & 0 & 0 & 0 & 0 & 0 & 1 & 0 & 0 & 0 & 0 \\ 0 & 1 & 0 & 0 & 0 & 0 & 0 & 0 & 1 & 0 & 0 & 0 \\ 0 & 0 & 1 & 0 & 0 & 0 & 1 & 0 & 0 & 0 & 0 & 0 \\ 0.379 & 0.379 & 0.242 & 0.758 & -0.606 & 0.606 & 0.065 & 0.557 & 0.379 & -0.379 & -0.313 & 0.918 \\ 0.242 & 0.379 & 0.379 & -0.606 & -0.606 & 0.758 & 0.379 & 0.065 & 0.557 & -0.313 & 0.918 & -0.379 \\ 0.379 & 0.242 & 0.379 & -0.606 & 0.758 & -0.606 & 0.557 & 0.379 & 0.065 & 0.918 & -0.379 & -0.313 \\ 0.97 & 0.015 & 0.015 & 0.242 & 0.242 & 0.03 & 0.015 & 0.985 & 0 & -0.244 & 0.002 & -0.015 \\ 0.015 & 0.97 & 0.015 & 0.242 & 0.03 & 0.242 & 0 & 0.015 & 0.985 & 0.002 & -0.015 & -0.244 \\ 0.015 & 0.015 & 0.97 & 0.03 & 0.242 & 0.242 & 0.985 & 0 & 0.015 & -0.015 & -0.244 & 0.002 \\ 0.486 & 0.486 & 0.027 & 0.973 & -0.23 & -0.23 & 0.174 & 0.339 & 0.486 & -0.486 & -0.583 & 0.812 \\ 0.027 & 0.486 & 0.486 & -0.23 & -0.23 & 0.973 & 0.486 & 0.174 & 0.339 & -0.583 & 0.812 & -0.486 \\ 0.486 & 0.027 & 0.486 & -0.23 & 0.973 & -0.23 & 0.339 & 0.486 & 0.174 & 0.812 & -0.486 & -0.583 \end{pmatrix}$$

The determinate is:

$|M| = 2.009 \cdot 10^{-8}$

Since the determinate is not zero, there is a unique solution for this set of positions. The solution for each variable may be found by expressing the unknown as a fraction of two determinants with the denominator being the determinate of M and the numerator obtained from M by replacing the column of coefficients of the unknown in question by the square of the voltage read at that position. For example, the solution for Py would be:

$$P_y^2 = \frac{\begin{vmatrix} (S_1)^2 & 0 & 0 & 0 & 0 & 0 & 0 & 1 & 0 & 0 & 0 & 0 \\ (S_2)^2 & 1 & 0 & 0 & 0 & 0 & 0 & 0 & 1 & 0 & 0 & 0 \\ (S_3)^2 & 0 & 1 & 0 & 0 & 0 & 1 & 0 & 0 & 0 & 0 & 0 \\ (S_4)^2 & 0.379 & 0.242 & 0.758 & -0.606 & -0.606 & 0.065 & 0.557 & 0.379 & -0.379 & -0.313 & 0.918 \\ (S_5)^2 & 0.379 & 0.379 & -0.606 & -0.606 & 0.758 & 0.379 & 0.065 & 0.557 & -0.313 & 0.918 & -0.379 \\ (S_6)^2 & 0.242 & 0.379 & -0.606 & 0.758 & -0.606 & 0.557 & 0.379 & 0.065 & 0.918 & -0.379 & -0.313 \\ (S_7)^2 & 0.015 & 0.015 & 0.242 & 0.242 & 0.03 & 0.015 & 0.985 & 0 & -0.244 & 0.002 & -0.015 \\ (S_8)^2 & 0.97 & 0.015 & 0.242 & 0.03 & 0.242 & 0 & 0.015 & 0.985 & 0.002 & -0.015 & -0.244 \\ (S_9)^2 & 0.015 & 0.97 & 0.03 & 0.242 & 0.242 & 0.985 & 0 & 0.015 & -0.015 & -0.244 & 0.002 \\ (S_{10})^2 & 0.486 & 0.027 & 0.973 & -0.23 & -0.23 & 0.174 & 0.339 & 0.486 & -0.486 & -0.583 & 0.812 \\ (S_{11})^2 & 0.486 & 0.486 & -0.23 & -0.23 & 0.973 & 0.486 & 0.174 & 0.339 & -0.583 & 0.812 & -0.486 \\ (S_{12})^2 & 0.027 & 0.486 & -0.23 & 0.973 & -0.23 & 0.339 & 0.486 & 0.174 & 0.812 & -0.486 & -0.583 \end{vmatrix}}{2.009 \cdot 10^{-8}}$$

The remaining 5 dipole moments would be calculated in a similar manner.

Once the 6 dipole moments are computed, embodiments of the present invention contemplate that the total radiated power is calculated. This quantity can be used to predict the field strength which will be radiated by the EUT. While many approaches may be taken, one approach is to assume that the radiator is a simple dipole.

It should be noted that both Example 1 and Example 2 can be used to accurately measure frequencies below the 30 MHz level.

Examples of how embodiments of the present invention reduce the effect of reorientation of cables such as AC power cables during testing the EUT is now discussed in conjunction with Examples 1 and 2 above, and with regard to FIGS. 12a, 12b, 12c, 12d, 12e, 13a, 13b and 13c. Referring first to FIGS. 12a, 12b, 12c, 12d and 12e, this Figure shows the position of TEM cell 102 from various angles during MEASUREMENTS 1 and 5 of Example 1, in which TEM cell 102 is tilted to 0 degrees and 90 degrees, respectively. The designations + or −X, Y and Z represent that portion of the TEM cell 102 that is shown in the designated view. The tilt shown by MEASUREMENT 5 assumes that the axis of rotation is 45 degrees off the centerline of the TEM cell 102.

The position of the cable 1202 is shown in each view for both MEASUREMENTS. As can be seen, there is relatively little motion in the cable as it tilts from 0 to 90 degrees. This is largely due to keeping the relative motion between the connector (e.g., where the cable exits the TEM) and the EUT relatively small.

Figure 13A:
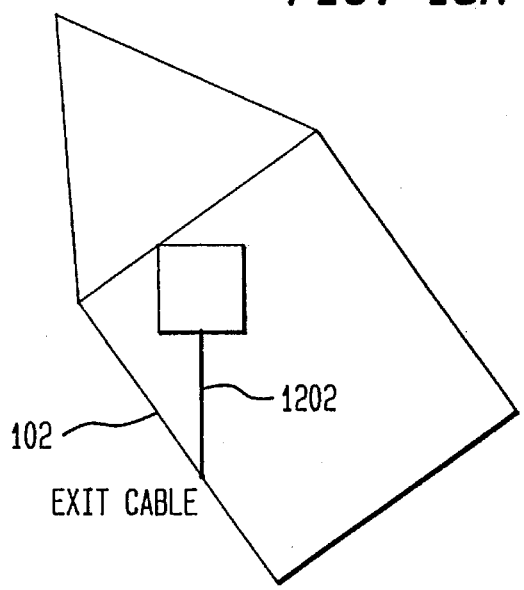
FIGS. 13a, 13b and 13c depict the effect of the present invention on cabling, as contemplated by second embodiments of the present invention.
Figure 13B:
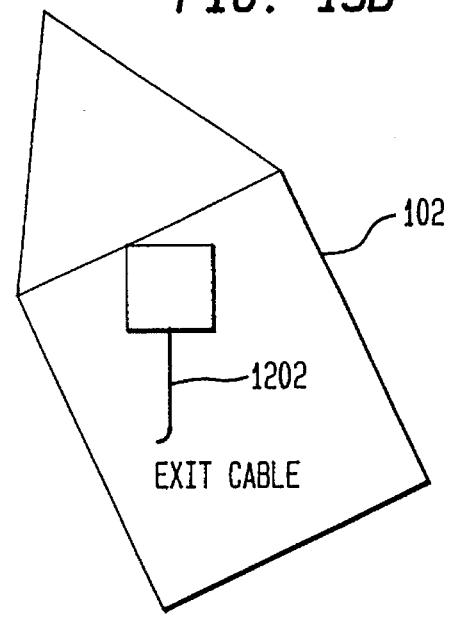
Figure 13C:
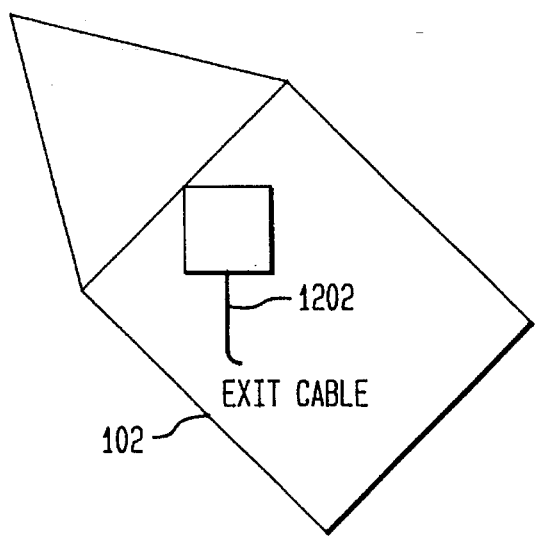

Referring now to FIGS. 13a, 13b and 13c, this Figure shows the position of TEM cell 102 as TEM cell 102 is tilted to 44.736 degrees, 54.736 degrees and 64.736 degrees, in accordance with Example 2 above. Again, cable 1202 is shown having little relative movement throughout the transition. Here, a large factor is the relatively small degree of tilt of the TEM cell 102 necessitated by these embodiments of the present invention.

It should be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention.

It should also be understood that the present invention is not limited to the embodiments indicated above, and that the examples presented above are merely for the purposes of illustration. The scope of the present invention should therefore be interpreted by the following claims as defined by the forgoing figures and text.

What is claimed is:

1. A system for obtaining electromagnetic measurements from a test object, comprising:

a hollow cell for inserting the test object,
   said hollow cell comprising an electromagnetically conductive material for conducting electromagnetic radiation generated by the test object, and being tiltable about at least one axis, said at least one axis being perpendicular to the direction of the force of gravity;

a table rotatable about its vertical axis within said hollow cell, the test object being positioned upon said table; and a fixed tilt mechanism for maintaining said table in a fixed tilt position relative to said at least one axis as said hollow cell is tilted about said at least one axis perpendicular to the direction of the force of gravity.

2. The system of claim 1, wherein said hollow cell is configured in a pyramidal shape, and is a transverse electromagnetic cell.

3. The system of claim 1, wherein said hollow cell has a centerline and wherein said axis perpendicular to the direction of the force of gravity is positioned at an angle of 45 degrees relative to said centerline.

4. The system of claim 1, wherein said fixed tilt mechanism maintains said table with said vertical axis parallel to the direction of the force of gravity as said hollow cell is tilted about said at least one axis perpendicular to the direction of the force of gravity.

5. The system of claim 1, wherein said hollow cell is tiltable between an angle that is 0 degrees relative to said at least one axis perpendicular to the direction of the force of gravity through an angle that is 90 degrees relative to said at least one axis perpendicular to the direction of the force of gravity.

6. The system of claim 1, wherein said fixed tilt mechanism comprises:

a support structure, affixed to and tiltable with the hollow cell, for suspending said table within the hollow cell;

a mechanism, responsive to the tilted position of said support structure, for maintaining said table in an orientation in which said vertical axis is parallel to the direction of the force of gravity as the hollow cell and said support structure are tilted about the at least one axis perpendicular to the direction of the force of gravity.

7. A system for maintaining a test object in a fixed tilt position relative to at least one horizontal axis, said at least one horizontal axis being perpendicular to the force of gravity, within a tiltable hollow cell for obtaining electromagnetic measurements as the hollow cell is tilted about said at least one axis perpendicular to the direction of the force of gravity, the system comprising:

a table, rotatable about its vertical axis, upon which the test object is positioned;

a cradle, upon which said rotatable table rests and is rotatable relative thereto;

a support structure, affixed to and tiltable with the hollow cell, for suspending said cradle and said table within the hollow cell; and a drive mechanism, responsive to the tilted position of said support structure, for maintaining said cradle and said table in a fixed tilt position in relation to said at least one axis perpendicular to the direction of the force of gravity as the hollow cell and said support structure are tilted about the at least one horizontal axis of the hollow cell.

8. The system of claim 7, wherein said drive mechanism comprises a top drive wheel affixed to said cradle, wherein said top drive wheel is rotatable relative to said support structure, and wherein said top drive wheel is fixed in place relative to the hollow cell, such that said table is maintained in a position wherein its vertical axis is parallel to the direction of the force of gravity.

9. The system of claim 8, wherein said drive mechanism further comprises a bottom drive wheel positioned outside the hollow cell, wherein said bottom drive wheel does not move as a result of the tilting of said cell; and a drive belt for connecting said top drive wheel with said bottom drive wheel,
   said drive belt passing through the surface of the hollow cell.

10. The system of claim 7, further comprising a turn converter for laterally positioning said table relative to said cradle in response to the degree of tilt of said support structure.

11. The system of claim 10, further comprising a movable carriage upon which said table rests, wherein said turn converter moves said carriage and said table in response to the degree of tilt of said support structure.

12. A system for maintaining a test object in a fixed tilt position relative to at least one axis perpendicular to the direction of the force of gravity, within a tiltable hollow cell for obtaining electromagnetic measurements as the hollow cell is tilted about said at least one axis perpendicular to the direction of the force of gravity, the system comprising:

platform means, for positioning the test object, cradle means, for supporting said platform means,
said platform means being rotatable about its vertical axis relative to said cradle means;

support means, for suspending said cradle means and said table means within the hollow cell,
said support means affixed to and tiltable with the hollow cell; and drive means, responsive to the tilted position of said support means, for maintaining said cradle means and said table means in a fixed tilt position relative to said at least one axis perpendicular to the direction of the force of gravity as the hollow cell and said support means are tilted about the at least one axis of the hollow cell.

13. The system of claim 12, further comprising platform positioning means for laterally positioning said platform means relative to said cradle means in response to the degree of tilt of said support means.

14. The system of claim 13, wherein said platform positioning means comprises ratio conversion means for converting said degree of tilt of said support means into a plurality of revolutions of a shaft used to laterally position said platform means.

15. The system of claim 14, further comprising carriage means upon which said platform means rests, wherein said ratio conversion means moves said carriage means and said table means in response to the degree of tilt of said support means.

16. A system for obtaining electromagnetic measurements from a test object, comprising:

a hollow cell for inserting the test object,
said hollow cell being tiltable about at least one axis, said at least one axis being perpendicular to the direction of the force of gravity;

a table, rotatable about its vertical axis within said hollow cell, the test object being positioned upon said table;

a fixed tilt mechanism for maintaining said table in a fixed tilt position relative to said at least one axis perpendicular to the direction of the force of gravity as said hollow cell is tilted about said at least one axis;

an electric component and magnetic component separator, for containing a first set of angles at which said hollow cell is to be tilted; and a cell interface for obtaining electromagnetic measurements from the hollow cell, as generated by the test object at said first set of angles;
said electric component and magnetic component separator receiving said electromagnetic measurements and determining, using said electromagnetic measurements, the electric field and magnetic field generated by the test object.

17. The system of claim 16, wherein said E and M separator comprises a degeneracy detector for detecting degeneracies in said electromagnetic measurements, and for initiating the use of at least one electromagnetic measurement not otherwise required to determine the electric field and magnetic field generated by the test object.

18. The system of claim 16, wherein said E and M separator determines said electric field in terms of three electric dipole moments along the x, y and z axis, and determines said magnetic field in terms of three magnetic dipole moments along the x, y and z axis.

19. The system of claim 16, wherein said E and M separator comprises a second set of at least two angles at which said table is to be rotated to in conjunction with said first set of at least two angles.

20. The system of claim 16, wherein said hollow cell is configured in a pyramidal shape, and is a transverse electromagnetic cell.

21. The system of claim 16, wherein said hollow cell has an axis of symmetry, and wherein said at least one axis of said hollow cell is positioned at an angle of 45 degrees off said axis of symmetry of said hollow cell.

22. The system of claim 16, wherein said fixed tilt mechanism maintains said table in a position wherein its vertical axis is parallel to the direction of the force of gravity as said hollow cell is tilted about said at least one axis.

23. The system of claim 16, wherein said hollow cell is tiltable between an angle that is 0 degrees relative to said at least one axis perpendicular to the direction of the force of gravity through an angle that is 90 degrees relative to said at least one axis perpendicular to the direction of the force of gravity.

24. The system of claim 1, wherein said fixed tilt mechanism comprises:

a support structure, affixed to and tiltable with said hollow cell, for suspending said table within the hollow cell;

a drive mechanism, responsive to the tilted position of said support structure, for maintaining said table in a position wherein its vertical axis is parallel to the direction of the force of gravity as said hollow cell and said support structure are tilted about the at least one axis of the hollow cell.

25. The system of claim 16, further comprising a turn converter for laterally positioning said table relative to said hollow cell in response to the degree of tilt of said support structure.

26. A system for deriving electromagnetic measurements from a test object within a hollow cell, wherein the hollow cell can be tilted about at least one axis, said axis being perpendicular to the direction of the force of gravity, comprising:

an electric component and magnetic component separator, for containing a first set of at least two angles at which the hollow cell is to be tilted;

an information reception mechanism for receiving electromagnetic measurements from the hollow cell at each angle of said first set of at least two angles; and a measurement storage mechanism for storing the electromagnetic measurements received from said information reception mechanism;

wherein said electric component and magnetic component separator comprises an electric field determiner for determining the electric field of the test object using said electromagnetic measurements in said measurement storage mechanism, and wherein said electric component and magnetic component separator comprises a magnetic field determiner for determining the magnetic field of the test object using the electromagnetic measurements in said measurement storage mechanism.

27. The system of claim 26, wherein the electromagnetic measurements received by said information reception mechanism comprises a voltage representation, and wherein said electric component and magnetic component separator determines the electric field and the magnetic field using said voltage representation.

28. The system of claim 26, wherein each of said at least two angles are at least 30 degrees apart.

29. The system of claim 26, wherein said electric component and magnetic component separator comprises a second set of at least two angles at which a table within the hollow cell is to be rotated to in conjunction with said first set of at least two angles.

30. The system of claim 26, wherein said electric component and magnetic component separator determines said electric field in terms of three electric dipole moments along the x, y and z axis, and determines said magnetic field in terms of three magnetic dipole moments along the x, y and z axis.

31. A method for deriving electromagnetic measurements from a test object within a hollow cell, wherein the hollow cell can be tilted about at least one axis, the method comprising the steps of:

(1) receiving first electromagnetic measurement from the cell generated by the test object when the hollow cell is tilted at a first angle and storing said first electromagnetic measurement in a storage device;

(2) receiving second electromagnetic measurement from the cell generated by the test object when the hollow cell is tilted at a second angle and storing second electromagnetic measurement in said storage device;

(3) retrieving said first and second electromagnetic measurement from said storage device;

(4) determining at least one electric dipole moment using said first and second electromagnetic measurement obtained from said step (3); and (5) determining at least one magnetic dipole moment using said first and second electromagnetic measurement obtained from said step (3).

32. The method of claim 31, wherein said step (4) comprises the step of determining three electric dipole moments along the x, y and z axis, and wherein said step (5) comprises the step of determining three magnetic dipole moments along the x, y and z axis.

33. A system for obtaining electromagnetic measurements from a test object, comprising:

a hollow cell for inserting the test object,
said hollow cell comprising an electromagnetically conductive material for conducting electromagnetic radiation generated by the test object, and being tiltable about at least a first axis, said first axis being defined as an axis of said test object;

a table rotatable about a second axis within said hollow cell, said test object being positioned upon said table; and a fixed tilt mechanism for maintaining said table in a fixed position relative to said first axis as said hollow cell is tilted about said first axis.

34. A system as described in claim 33, further comprising a turn converter for maintaining said table within an ideal test volume in response to tilting of said hollow cell.

* * * * *